(12) United States Patent
    Yoon

(10) Patent No.: US 10,388,840 B1
(45) Date of Patent: Aug. 20, 2019

(54) LIGHT EMITTING DEVICE AND METHOD OF MANUFACTURING THE SAME

(71) Applicant: LG INNOTEK CO., LTD., Seoul (KR)

(72) Inventor: Jae Joon Yoon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 16/384,191

(22) Filed: Apr. 15, 2019

Related U.S. Application Data

(63) Continuation of application No. 16/254,811, filed on Jan. 23, 2019, which is a continuation of application No. 15/958,902, filed on Apr. 20, 2018, now Pat. No. 10,230,036, which is a continuation of application No. 15/784,573, filed on Oct. 16, 2017, now Pat. No.
(Continued)

(30) Foreign Application Priority Data

| Dec. 1, 2009 | (KR) | .......................... | 10-2009-0118084 |
| Dec. 1, 2009 | (KR) | .......................... | 10-2009-0118085 |
| Apr. 7, 2010 | (KR) | .......................... | 10-2010-0031987 |

(51) Int. Cl.
*H01L 33/62* (2010.01)
*H01L 33/38* (2010.01)
*H01L 33/44* (2010.01)
*H01L 33/54* (2010.01)
(Continued)

(52) U.S. Cl.
CPC .............. *H01L 33/62* (2013.01); *H01L 24/97* (2013.01); *H01L 33/38* (2013.01); *H01L 33/44* (2013.01); *H01L 33/486* (2013.01); *H01L 33/54* (2013.01); *H01L 2224/48091* (2013.01); *H01L 2224/48247* (2013.01); *H01L 2924/12035* (2013.01); *H01L 2924/12041* (2013.01); *H01L 2924/14* (2013.01); *H01L 2933/0066* (2013.01)

(58) Field of Classification Search
CPC ............................. H01L 33/38; H01L 33/385
See application file for complete search history.

(56) References Cited

U.S. PATENT DOCUMENTS

| 7,208,772 B2 * | 4/2007 | Lee ........................ | H01L 33/647 |
| | | | 257/99 |
| 7,854,535 B2 * | 12/2010 | Weng .................... | H01L 33/486 |
| | | | 362/296.07 |

(Continued)

FOREIGN PATENT DOCUMENTS

| CN | 101420007 | 4/2009 |
| DE | 198 29 197 | 1/2000 |

(Continued)

OTHER PUBLICATIONS

European Search Report issued in Application No. 10 19 2920 dated Mar. 9, 2011.
(Continued)

*Primary Examiner* — Earl N Taylor
(74) *Attorney, Agent, or Firm* — KED & Associates, LLP

(57) ABSTRACT

Disclosed is a light emitting device and a method of manufacturing the same. The light emitting device includes a body, a first electrode installed in the body and a second electrode separated from the first electrode, a light emitting chip formed on one of the first and second electrodes, and electrically connected to the first and second electrodes, and a protective cap projecting between the first and second electrodes.

30 Claims, 16 Drawing Sheets

Related U.S. Application Data 9,978,921, which is a continuation of application No. 15/617,764, filed on Jun. 8, 2017, now Pat. No. 9,831,409, which is a continuation of application No. 15/252,312, filed on Aug. 31, 2016, now Pat. No. 9,711,702, which is a continuation of application No. 14/825,785, filed on Aug. 13, 2015, now Pat. No. 9,461,223, which is a continuation of application No. 14/684,653, filed on Apr. 13, 2015, now Pat. No. 9,136,453, which is a continuation of application No. 14/290,783, filed on May 29, 2014, now Pat. No. 9,035,348, which is a continuation of application No. 12/956,626, filed on Nov. 30, 2010, now Pat. No. 8,772,816.

(51) Int. Cl.
*H01L 23/00* (2006.01)
*H01L 33/48* (2010.01)

(56) References Cited

U.S. PATENT DOCUMENTS

| | | | |
|---|---|---|---|
| 7,964,943 B2* | 6/2011 | Seo | H01L 33/54 257/676 |
| 8,735,931 B2 | 5/2014 | Han et al. | |
| 8,772,816 B2* | 7/2014 | Yoon | H01L 33/486 257/99 |
| 9,035,348 B2* | 5/2015 | Yoon | H01L 33/486 257/99 |
| 9,136,453 B2* | 9/2015 | Yoon | H01L 33/486 |
| 9,461,223 B2* | 10/2016 | Yoon | H01L 33/486 |
| 9,461,225 B2* | 10/2016 | Seo | H01L 33/54 |
| 9,711,702 B2* | 7/2017 | Yoon | H01L 33/486 |
| 9,831,409 B2* | 11/2017 | Yoon | H01L 33/486 |
| 9,978,921 B2* | 5/2018 | Yoon | H01L 33/486 |
| 2002/0084518 A1* | 7/2002 | Hasebe | H01L 23/3107 257/676 |
| 2004/0159850 A1 | 8/2004 | Takenaka | |
| 2004/0240203 A1* | 12/2004 | Matsumura | H01L 25/0753 362/227 |
| 2005/0063187 A1* | 3/2005 | Weng | H01L 33/486 362/296.04 |
| 2005/0151231 A1 | 7/2005 | Yoshida | |
| 2005/0280017 A1 | 12/2005 | Oshio et al. | |
| 2006/0043401 A1* | 3/2006 | Lee | H01L 33/647 257/99 |
| 2006/0180824 A1 | 8/2006 | Kim et al. | |
| 2006/0249746 A1* | 11/2006 | Oshio | H01L 25/0753 257/99 |
| 2006/0255355 A1* | 11/2006 | Brunner | H01L 33/486 257/98 |
| 2007/0126098 A1* | 6/2007 | Arndt | H01L 33/486 257/678 |
| 2007/0145387 A1 | 6/2007 | Lee et al. | |
| 2007/0252250 A1 | 11/2007 | Hui et al. | |
| 2007/0262328 A1* | 11/2007 | Bando | H01L 24/97 257/79 |
| 2008/0084699 A1 | 4/2008 | Park et al. | |
| 2008/0237627 A1* | 10/2008 | Kobayakawa | H01L 33/486 257/99 |
| 2008/0258162 A1 | 10/2008 | Koung et al. | |
| 2008/0277685 A1* | 11/2008 | Kim | H01L 33/62 257/99 |
| 2008/0296605 A1 | 12/2008 | Oshio et al. | |
| 2009/0189174 A1* | 7/2009 | Lee | H01L 25/167 257/99 |
| 2009/0197360 A1* | 8/2009 | Han | H01L 33/62 438/26 |
| 2009/0230410 A1* | 9/2009 | Joung | H01L 33/486 257/88 |
| 2009/0278153 A1* | 11/2009 | Cho | H01L 33/58 257/98 |
| 2009/0283790 A1* | 11/2009 | Tsou | H01L 33/62 257/99 |
| 2010/0025722 A1* | 2/2010 | Wada | H01L 33/486 257/99 |
| 2010/0065874 A1* | 3/2010 | Ono | H01L 33/486 257/98 |
| 2010/0102348 A1* | 4/2010 | Lin | H01L 33/486 257/98 |
| 2010/0123156 A1* | 5/2010 | Seo | H01L 33/54 257/99 |
| 2010/0270571 A1* | 10/2010 | Seo | H01L 33/486 257/98 |
| 2010/0314654 A1 | 12/2010 | Hayashi | |
| 2011/0127566 A1* | 6/2011 | Yoon | H01L 33/486 257/99 |
| 2012/0086133 A1* | 4/2012 | Yamaji | H01L 21/568 257/782 |
| 2017/0279021 A1* | 9/2017 | Yoon | H01L 33/486 |
| 2018/0053885 A1* | 2/2018 | Yoon | H01L 33/486 |

FOREIGN PATENT DOCUMENTS

| | | |
|---|---|---|
| DE | 10 2007 001 706 | 7/2008 |
| EP | 2 109 157 | 10/2009 |
| EP | 2 187 459 | 5/2010 |
| JP | 61-001067 | 1/1986 |
| JP | 05-251485 | 9/1993 |
| JP | 11-026667 | 1/1999 |
| JP | 2000-022217 | 1/2000 |
| JP | 2001-177160 | 6/2001 |
| JP | 2002-110888 | 4/2002 |
| JP | 2002-261187 | 9/2002 |
| JP | 2002-314138 | 10/2002 |
| JP | 2005-197329 | 7/2005 |
| JP | 2005-353914 | 12/2005 |
| JP | 2006-229205 | 8/2006 |
| JP | 2006-303397 | 11/2006 |
| JP | 2007-036294 | 2/2007 |
| JP | 2007-194517 | 8/2007 |
| JP | 2008-042158 | 2/2008 |
| JP | 2008-251937 | 10/2008 |
| JP | 2008-270822 | 11/2008 |
| JP | 2009-070870 | 4/2009 |
| JP | 2009/130359 | 6/2009 |
| KR | 10-2005-0081715 | 8/2005 |
| KR | 10-2006-0091979 | 8/2006 |
| KR | 10-2006-0135498 | 12/2006 |
| KR | 10-0765239 | 10/2007 |
| KR | 10-2007-0109771 | 11/2007 |
| KR | 10-2008-0041794 | 5/2008 |
| KR | 10-2008-0088827 | 10/2008 |
| KR | 10-0888236 | 3/2009 |
| KR | 10-2009-0082641 | 7/2009 |
| KR | 10-2010-0043401 | 4/2010 |
| KR | 10-2010-0108969 | 10/2010 |
| WO | WO 2008/081794 | 7/2008 |
| WO | WO 2009/025462 | 2/2009 |

OTHER PUBLICATIONS

European Search Report issued in Application No. 10 19 2920 dated Nov. 9, 2011.

Japanese Office Action issued in Application No. 2010-264845 dated Mar. 27, 2014.

Korean Notice of Allowance issued in Application No. 10-2009-0118086 dated Apr. 7, 2011.

Korean Notice of Allowance issued in Application No. 10-2010-0031987 dated Aug. 4, 2011.

U.S. Office Action issued in U.S. Appl. No. 12/956,626 dated Dec. 14, 2011.

U.S. Office Action issued in U.S. Appl. No. 12/956,626 dated Jun. 19, 2012.

U.S. Office Action issued in U.S. Appl. No. 12/956,626 dated Nov. 8, 2012.

U.S. Office Action issued in U.S. Appl. No. 12/956,626 dated Jun. 18, 2013.

(56) References Cited

OTHER PUBLICATIONS

U.S. Office Action issued in U.S. Appl. No. 12/956,626 dated Oct. 1, 2013.
U.S. Notice of Allowance issued in U.S. Appl. No. 12/956,626 dated Feb. 13, 2014.
U.S. Office Action issued in U.S. Appl. No. 14/290,783 dated Jul. 22, 2014.
European Office Action issued in Application No. 10 192 920.6 dated Nov. 11, 2014.
Japanese Office Action issued in Application No. 2010-264845 dated Nov. 26, 2014.
U.S. Notice of Allowance issued in U.S. Appl. No. 14/290,783 dated Jan. 12, 2015.
Japanese Office Action issued in Application No. 2010-264845 dated Jun. 17, 2015.
U.S. Notice of Allowance issued in U.S. Appl. No. 14/684,653 dated May 8, 2015.
U.S. Office Action issued in U.S. Appl. No. 14/825,785 dated Jan. 15, 2016.
European Summons dated Feb. 20, 2017 issued in Application No. 10192920.6.
U.S. Notice of Allowance dated Jul. 27, 2017 issued in co-pending U.S. Appl. No. 15/617,764.
European Search Report dated May 24, 2018 issued in Application No. 18164136.6.
U.S. Office Action dated Jun. 15, 2018 issued in co-pending U.S. Appl. No. 15/958,902.

\* cited by examiner

FIG. 9
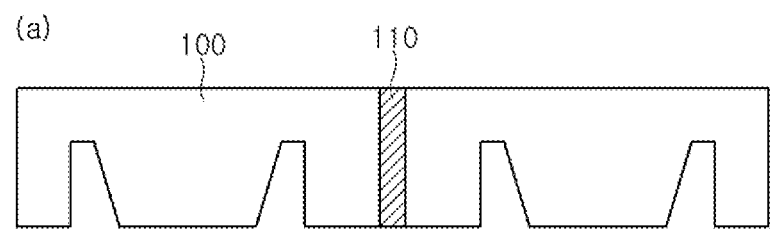
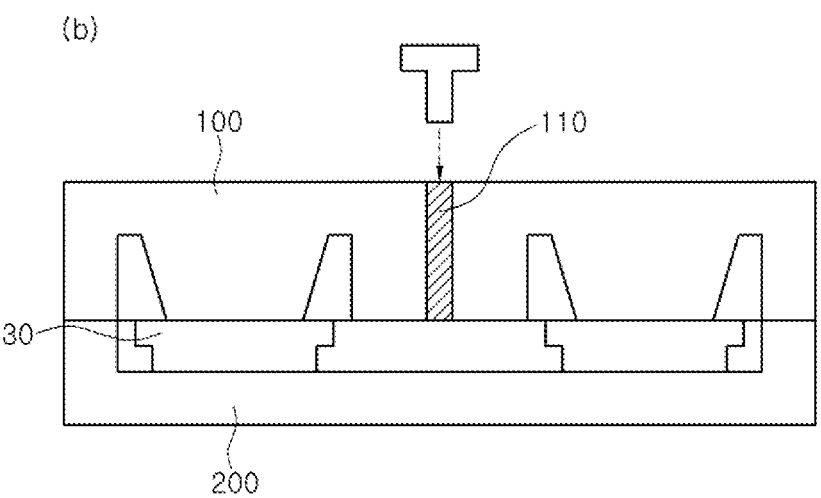
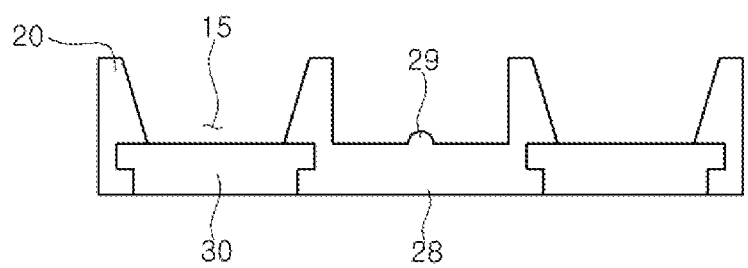

LIGHT EMITTING DEVICE AND METHOD OF MANUFACTURING THE SAME

CROSS-REFERENCE TO RELATED APPLICATIONS

This application is a Continuation Application of U.S. patent application Ser. No. 16/254,811, filed on Jan. 23, 2019, which is a continuation application of U.S. patent application Ser. No. 15/958,902, filed on Apr. 20, 2018 (now U.S. Pat. No. 10,230,036), which is a continuation application of U.S. patent application Ser. No. 15/784,573, filed Oct. 16, 2017 (now U.S. Pat. No. 9,978,921), which is a continuation application of U.S. patent application Ser. No. 15/617,764, filed on Jun. 8, 2017 (now U.S. Pat. No. 9,831,409), which is a continuation application of U.S. patent application Ser. No. 15/252,312, filed on Aug. 31, 2016 (now U.S. Pat. No. 9,711,702), which is continuation application of U.S. patent application Ser. No. 14/825,785, filed on Aug. 13, 2015 (now U.S. Pat. No. 9,461,223), which is a continuation application of U.S. patent application Ser. No. 14/684,653, filed on Apr. 13, 2015 (now U.S. Pat. No. 9,136,453), which is a continuation application of U.S. patent application Ser. No. 14/290,783, filed on May 29, 2014 (now U.S. Pat. No. 9,035,348), which is a continuation application of U.S. patent application Ser. No. 12/956,626, filed on Nov. 30, 2010 (now U.S. Pat. No. 8,772,816), which claims priority under 35 U.S.C. § 119 to Korean Application Nos. 10-2009-0118084 filed on Dec. 1, 2009, 10-2009-0118085 filed on Dec. 1, 2009 and 10-2010-0031987 filed on Apr. 7, 2010, whose entire disclosures are hereby incorporated by reference.

BACKGROUND

1. Field

The embodiment relates to a light emitting device and a method of manufacturing the same.

2. Background

Light emitting diodes (LEDs) are a kind of semiconductor devices that convert electric energy into light. The LED is advantageous as compared with conventional light sources, such as a fluorescent lamp or a glow lamp, in terms of power consumption, life span, response speed, safety and environmental-friendly requirement. In this regard, various studies have been performed to replace the conventional light sources with the LEDs. The LEDs are increasingly used as light sources for lighting devices such as various lamps used in the interior or the exterior of a building, liquid crystal displays, electric signboards, and street lamps.

SUMMARY

The embodiment provides a light emitting device having a novel structure and a method of manufacturing the same.
The embodiment provides a light emitting device capable of improving reliability and a method of manufacturing the manufacturing.
According to the embodiment, the light emitting device includes a body, a first electrode installed in the body and a second electrode separated from the first electrode, a light emitting chip formed on one of the first and second electrodes, and electrically connected to the first and second electrodes, and a protective cap projecting between the first and second electrodes.

The embodiment can provide a light emitting device having a novel structure and a method of manufacturing the same.

The embodiment can provide a light emitting device capable of improving reliability and a method of manufacturing the manufacturing.

BRIEF DESCRIPTION OF THE DRAWINGS

FIGS. 7 to 10 are views showing a method of manufacturing the light emitting device according to the embodiment;

DETAILED DESCRIPTION OF THE EMBODIMENTS

Figure 1:
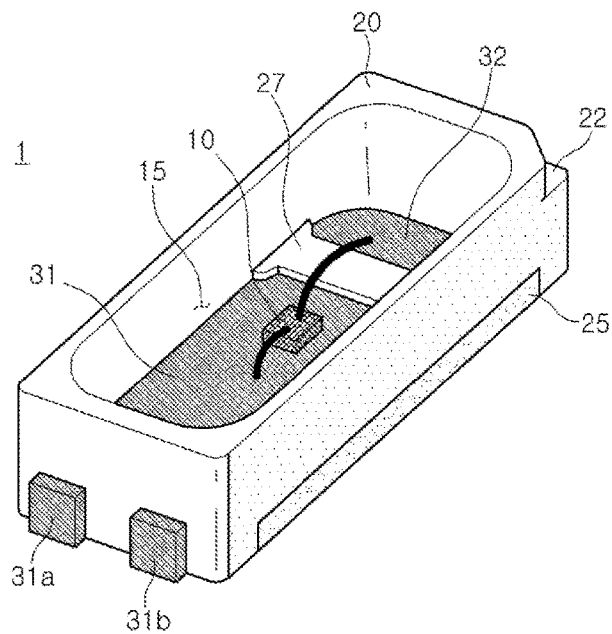
FIG. 1 is a top perspective view showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device 1 and a method of manufacturing the same according to the embodiment will be describe with reference to accompanying drawings.

Figure 2:
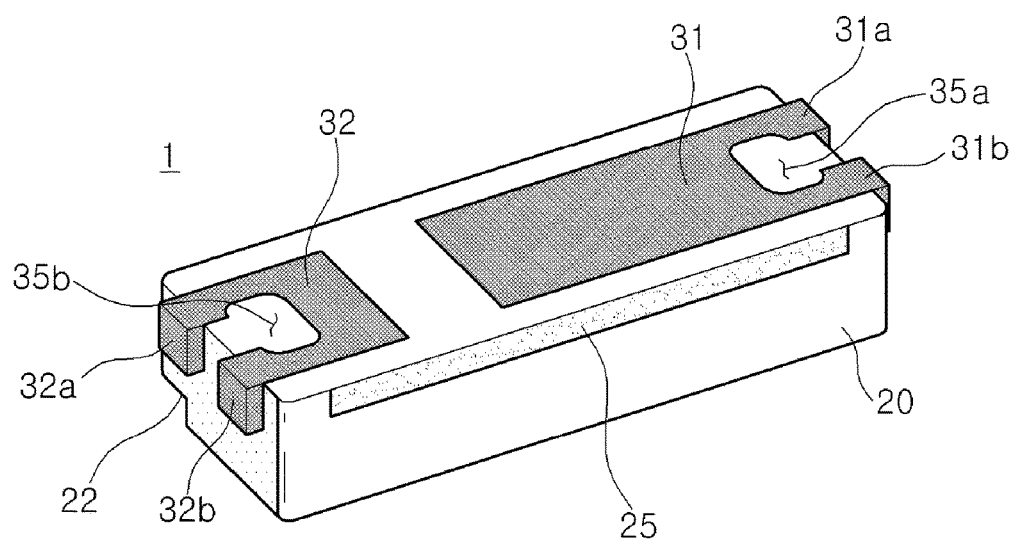
FIG. 2 is a bottom perspective view showing the light emitting device of FIG. 1.
Figure 3:
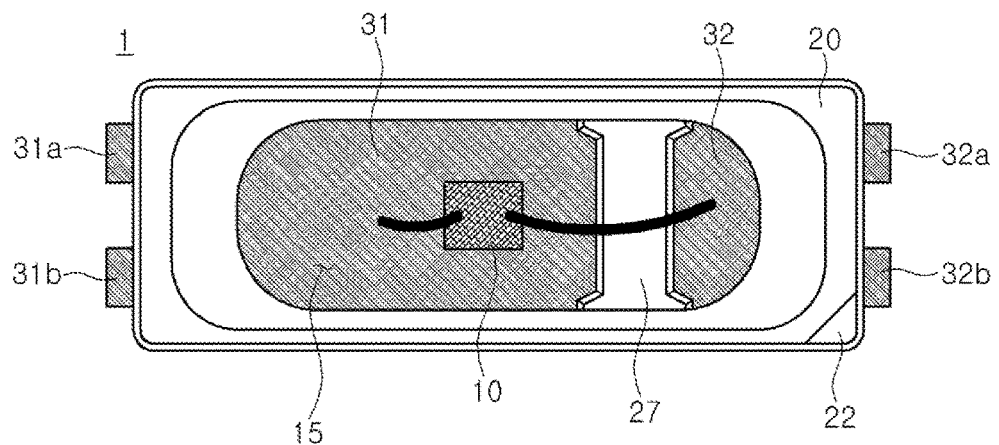
FIG. 3 is a plan view showing the light emitting device of FIG. 1.
Figure 4:
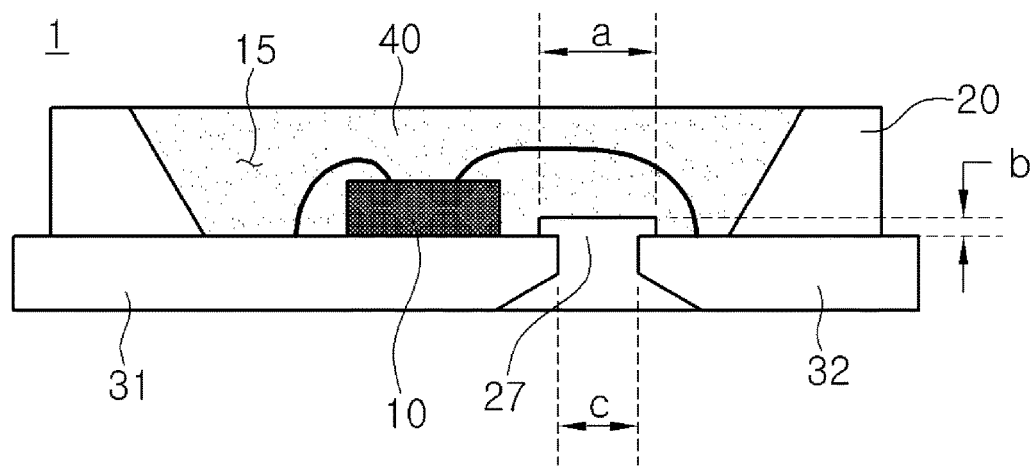
FIG. 4 is a sectional view showing the light emitting device of FIG. 1.

FIG. 1 is a top perspective view showing the light emitting device 1 according to the embodiment, and FIG. 2 is a bottom perspective view showing the light emitting device 1 according to the embodiment. FIG. 3 is a plan view showing the light emitting device 1, and FIG. 4 is a sectional view showing the light emitting device 1.

Referring to FIGS. 1 to 4, the light emitting device 1 according to the embodiment includes a body 20 provided at one lateral surface or more thereof with a roughness 25, first and second electrodes 31 and 32 installed in the body 20, a light emitting chip 10 mounted on one of the first and second electrodes 31 and 32 and electrically connected to the first electrode 31 or the second electrode 32 to emit light, and a protective cap 27 protruding between the first and second electrodes 31 and 32.

The body 20 may include at least one selected from the group consisting of resin material such as PPA (Polyphthalamide), Si (Silicon), metallic material, PSG (photo sensitive glass), sapphire ($Al_2O_3$), and (PCB (Printed Circuit Board).

If the body 20 includes electrically conductive material, an insulating layer (not shown) may be additionally formed on the surface of the body 20, so that the body 20 can be prevented from forming a short-circuit with the first and second electrodes 31 and 32.

The body 20 may have a top surface in various shapes such as the rectangular shape, a polygonal shape, and a circular shape according to the use and design of the light emitting device 1. For example, as shown in FIG. 1, the light emitting device 1 having a rectangular shape may be used for an edge-type BLU (Backlight Unit).

A cavity 15 may be formed in the body 20 such that an upper portion of the body 20 is opened. The cavity 15 may have a cup shape or a concave vessel shape. An internal lateral surface of the cavity 15 may be perpendicular to the bottom surface of the body 20 or inclined with respect to the bottom surface of the body 20.

When viewed in a plan view, the cavity 15 may have a circular shape, a rectangular shape, a polygonal shape, or an oval shape. In addition, as shown in FIGS. 1 and 3, the cavity 15 may have a rectangular shape with a curved corner when viewed in a plan view.

The roughness 25 may be formed on at least one lateral surface of the body 20. The roughness 25 is formed by the manufacturing process of the light emitting device 1 according to the embodiment, in detail, a cutting process of separating a plurality of light emitting devices in the unit of a device, but the embodiment will be described below.

In addition, a cathode mark 22 may be formed at the upper portion of the body 20. The cathode mark 22 is used to distinguish between the first and second electrodes 31 and 32 of the light emitting device 1, so that the polarities of the first and second electrodes 31 and 32 can be distinguished.

The first and second electrodes 31 and 32 are electrically insulated from each other in the body 20. The first and second electrodes 31 and 32 are electrically connected to the light emitting chip 10 to supply power to the light emitting chip 10.

The first and second electrodes 31 and 32 may include metallic material, for example, may include at least one selected from the group consisting of Ti, Cu, Ni, Au, Cr, Ta, Pt, Sn, Ag, and P. The first and second electrodes 31 and 32 may have a single layer structure or a multi-layer structure, but the embodiment is not limited thereto.

The first and second electrodes 31 and 32 pass through the bottom surface of the body 20 to form the bottom surface of the light emitting device 1. Terminals of the first and second electrodes 31 and 32 may be exposed to the outside of the body 20.

Since the first and second electrodes 31 and 32 pass through the body 20, heat generated from the light emitting chip 10 mounted on one of the first and second electrodes 31 and 32 may be discharged through the first electrode 31 or the second electrode 32.

Soldering may be performed with respect to the terminals of the first and second electrodes 31 and 32 protruding out of the outside of the body 20, such that the light emitting device 1 may be easily mounted on an external member such as a substrate.

Hereinafter, the first and second electrodes 31 and 32 will be described in more detail.

Figure 5:
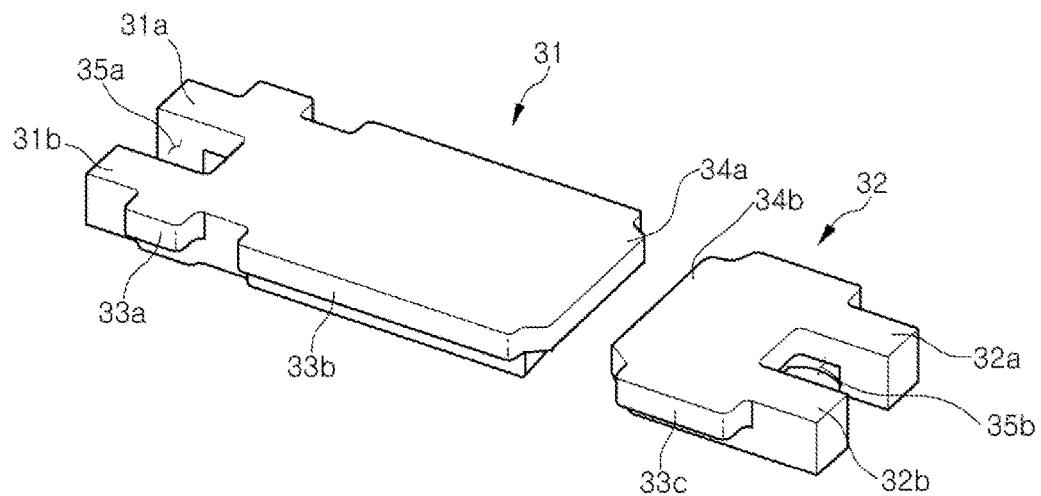
FIG. 5 is a top perspective view showing first and second electrodes of the light emitting device according to the embodiment.
Figure 6:
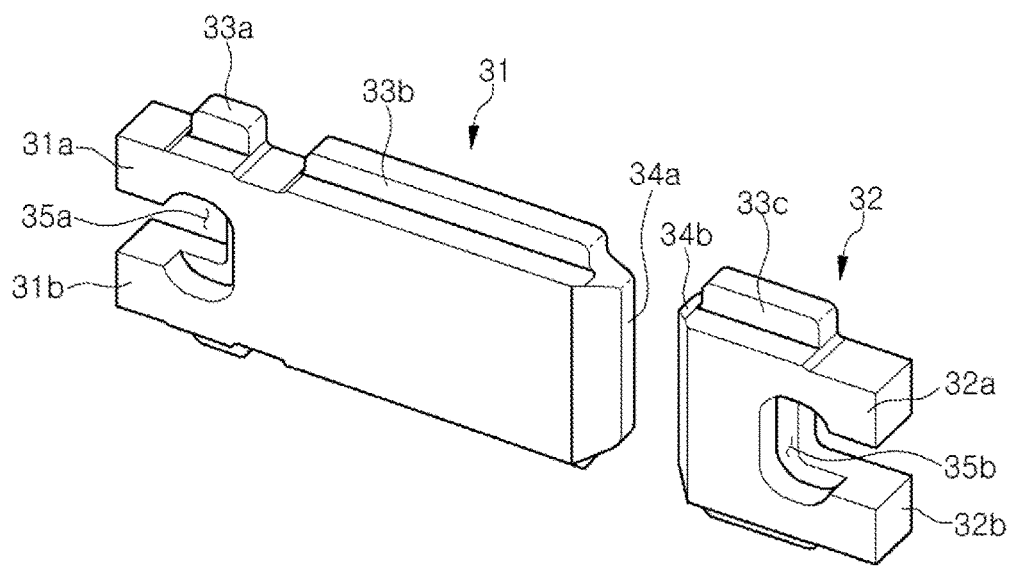
FIG. 6 is a bottom perspective view showing the first and second electrodes of FIG. 5.

FIG. 5 is a top perspective view showing the first and second electrodes 31 and 32, and FIG. 6 is a bottom perspective view showing the first and second electrodes 31 and 32.

Referring to FIGS. 5 and 6, the terminals of the first and second electrodes 31 and 32 exposed out of the body 20 may be branched into a plurality of sub electrodes 31a and 31b and a plurality of sub electrodes 32a and 32b, respectively. For example, as shown in FIG. 5, the terminal of the first electrode 31 is branched into the two first sub electrodes 31a and 31b, and the terminals of the second electrode 32 may be branched into the two second sub electrodes 32a and 32b.

Upper and lower portions of lateral surfaces of a first recess part 35a between the two first sub electrodes 31a and 31b and a second recess part 35b between the two second sub electrodes 32a and 32b may have step structures, and the lower portion of the lateral surfaces may have a curved surface.

Protrusions 33a, 33b, and 33c may be formed from a top portion of at least one lateral surface of the first and second electrodes 31 and 32. The protrusions 33a, 33b, and 33c have a step structure with respect to bottom portions of the first and second electrodes 31 and 32. Accordingly, a region in which the widths of the top surfaces of the first and second electrodes 31 and 32 may be greater than the widths of the bottom surfaces of the first and second electrodes 31 and 32 by the protrusions 33a, 33b, and 33c, may be formed, and may have a section in the shape of T.

Two facing lateral surfaces 34a and 34b of the first and second electrodes 31 and 32 may be inclined or may have a step structure.

The body 20 and the first and second electrodes 31 and 32 may be firmly coupled with each other, and the first and second electrodes 31 and 32 can be prevented from being separated from the body 20 by the above structure of the first and second electrodes 31 and 32. In addition, since the surface area of the first and second electrodes 31 and 32 is increased due to the structure, the light emission efficiency of the light emitting device 1 can be improved.

Even if the first and second electrodes 31 and 32 have different thicknesses according to regions, the first and second electrodes 31 and 32 have to preferably have a sufficient thickness to form the bottom surface of the light emitting device 1. To this end, the thickness of the first and second electrodes 31 and 32 may be in the range of about 0.1 mm to about 0.5 mm, but the embodiment is not limited thereto.

Referring to FIGS. 1 to 4 again, the protective cap 27 may protrude between the first and second electrodes 31 and 32. The protective cap 27 covers the gaps among the first electrode 31, the second electrode 32, and the body 20 to prevent moisture or air from infiltrating into the light emitting device 1 and prevent the gap from being widened in the long term, so that the reliability for the light emitting device 1 can be improved.

The protective cap 27 protrudes between the first and second electrodes 31 and 32. Accordingly, the protective cap 27 may be integrated with the body 20 in the manufacturing process of the light emitting device 1, and may include a material the same as that of the body 20.

The protective cap 27 may be separated from the body 20. In this case, the protective cap 27 includes a material different from that of the body 20.

The protective cap 27 protrudes between the first and second electrodes 31 and 32 in order to cover the gap between the first and second electrodes 31 and 32 and the body 20, so that the protective cap 27 may surround lateral surfaces and at least a portion of the top surfaces of the first and second electrodes 31 and 32.

For example, as shown in FIG. 4, when the first and second electrodes 31 and 32 are spaced apart from each other at a first distance c, a width a of the protective cap 27 is 0.02 mm to 0.5 mm greater than the first distance c, so that the protective cap 27 may surround the lateral surfaces and at least a portion of the top surfaces of the first and second electrodes 31 and 32, but the embodiment is not limited thereto.

Although a thickness b of the protective cap 27 may be in the range of 0.01 mm to 0.1 mm, the thickness b may have various values to ensure the reliability and the workability for the protective cap 27.

The light emitting chip 10 may be mounted on one of the first and second electrodes 31 and 32, and electrically connected to the first and second electrodes 31 and 32 to receive power such that light can be generated. Since the light emitting chip 10 is mounted on one of the first and second electrodes 31 and 32, the light generated from the light emitting chip 10 is effectively transferred to the first and second electrodes 31 and 32 and discharged to the outside.

For instance, the light emitting chip 10 may include at least one LED (light emitting diode), and the LED may include a color LED to emit red, green, blue, white light or a UV (Ultra Violet) LED to emit a ultraviolet ray, but the embodiment is not limited thereto.

The light emitting device 1 is electrically connected to the first electrode 31 or the second electrode 32 through a wire bonding scheme.

The light emitting device 1 is electrically connected to the first electrode 31 or the second electrode 32 through a flip chip bonding scheme or a die bonding scheme.

As shown in FIG. 4, an encapsulant 40 may be formed in the cavity 15 of the body 20 to seal and protect the light emitting chip 10. The encapsulant 40 may include a luminescence material.

The encapsulant 40 may include silicon or resin material. The encapsulant 40 may be formed by hardening the silicon or the resin material that has been filled in the cavity 15, but the embodiment is not limited thereto.

The luminescence material may be contained in the encapsulant 40, and may be excited by a first light emitted from the light emitting chip 10 to generate a second light. For example, when the light emitting chip 10 includes a blue LED, and the luminescence material includes a yellow luminescence material, the yellow luminescence material is excited by blue light to emit yellow light. Therefore, the blue light is mixed with the yellow light, so that the light emitting device 1 can provide white color light, but the embodiment is not limited thereto.

Meanwhile, a lens (not shown) is additionally formed over the encapsulant 40, so that the distribution of light emitted from the light emitting device 1 can be adjusted. In addition, a zener diode to improve the withstanding voltage may be additionally installed in the body 20 of the light emitting device 1.

Hereinafter, the method of manufacturing the light emitting device 1 according to the embodiment will be described in detail.

Figure 10:
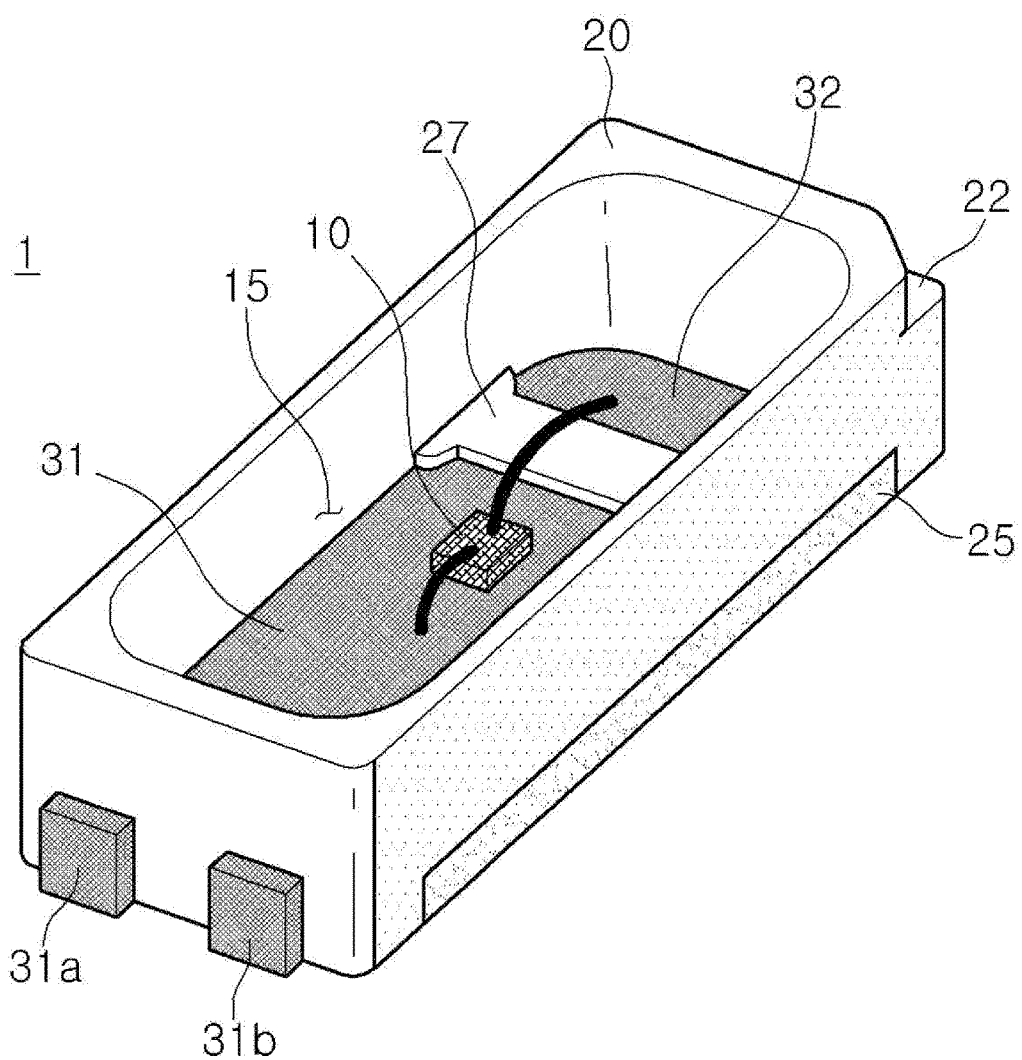
Figure 11:
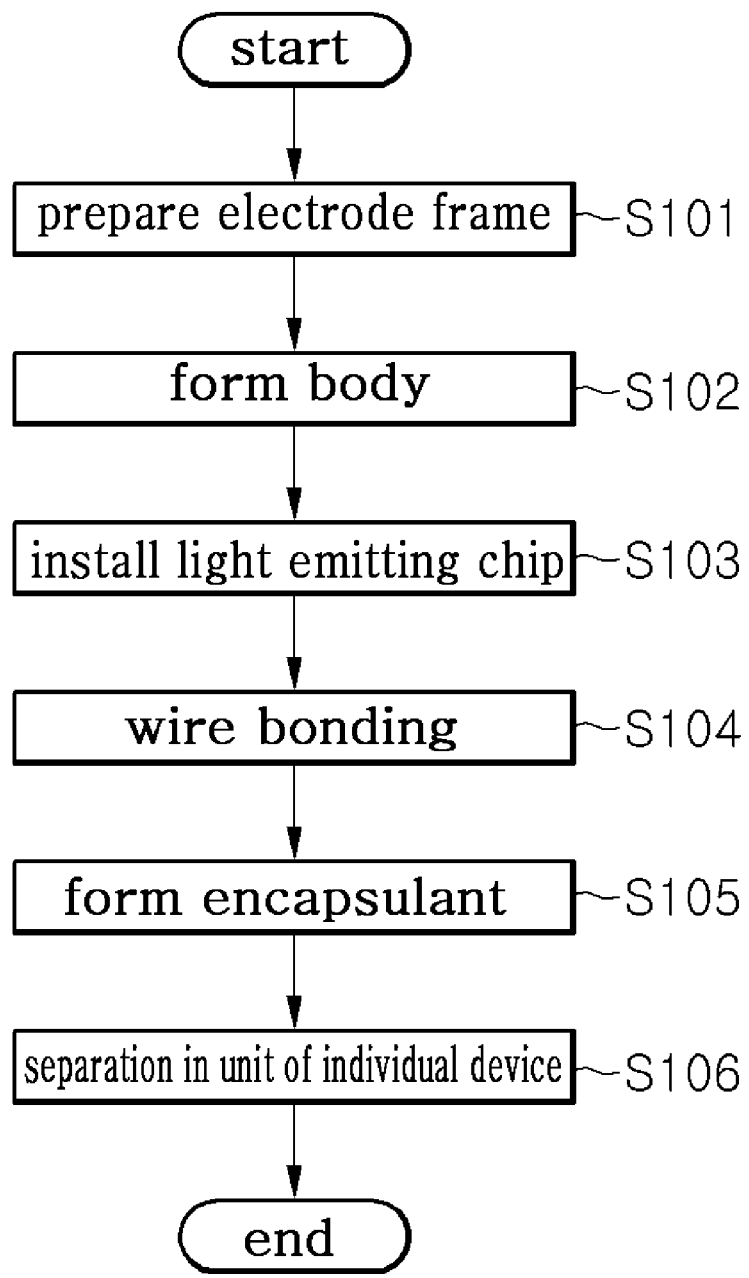
FIG. 11 is a flowchart showing the method of manufacturing the light emitting device according to the embodiment.

FIGS. 7 to 10 are views showing the method of manufacturing the light emitting device 1 according to the embodiment, and FIG. 11 is a flowchart showing the method of manufacturing the light emitting device 1 according to the embodiment.

Figure 7:
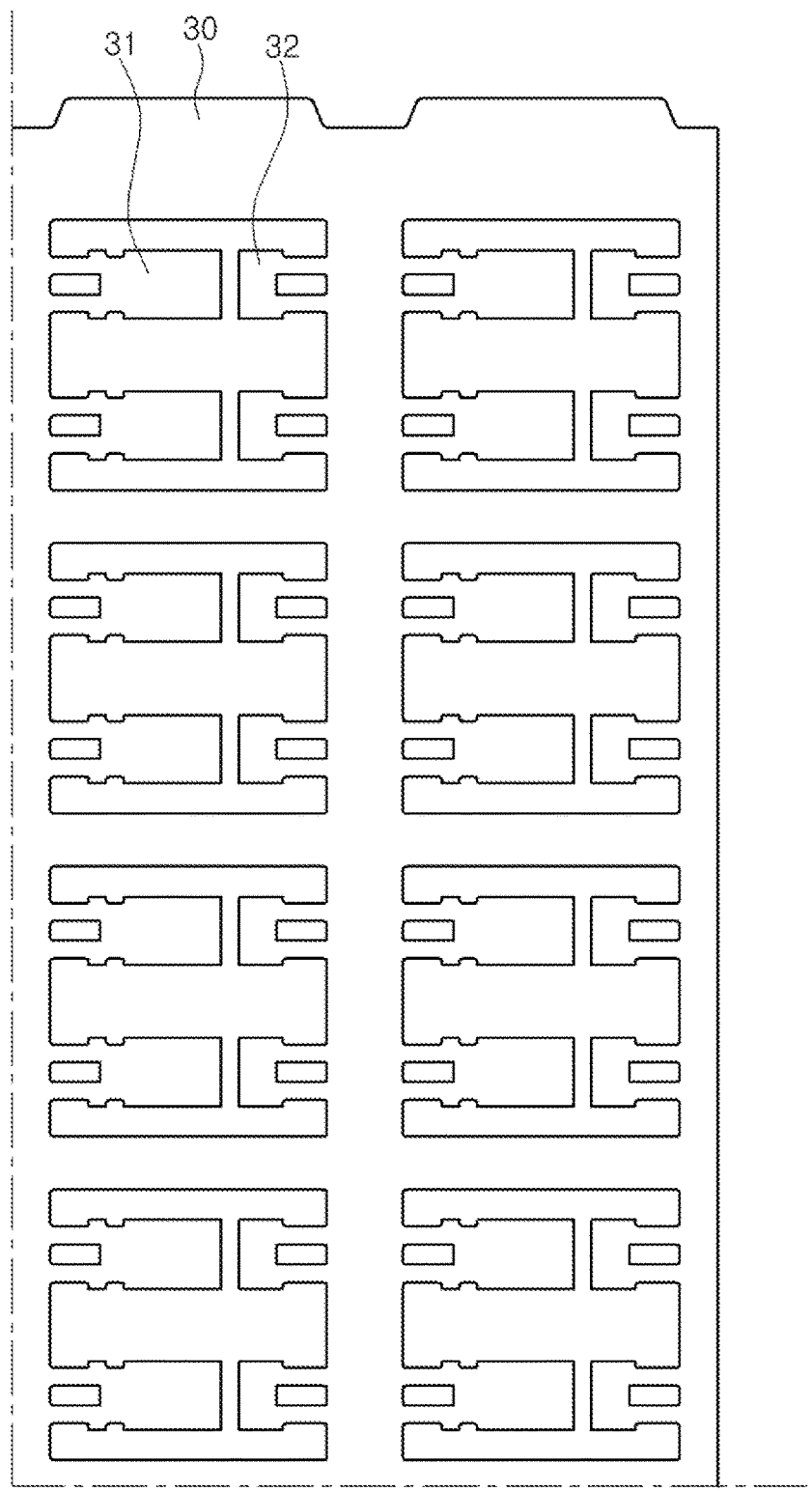

First, referring to FIG. 7, an electrode frame 30 on which the first and second electrodes 31 and 32 are formed is prepared (step S101 of FIG. 11).

A plurality of light emitting devices 1 can be simultaneously manufactured by forming the electrode frame 30. For example, the electrode frame 30 may be formed through a photolithography process, a plating process, or a deposition process, but the embodiment is not limited thereto.

Figure 8:
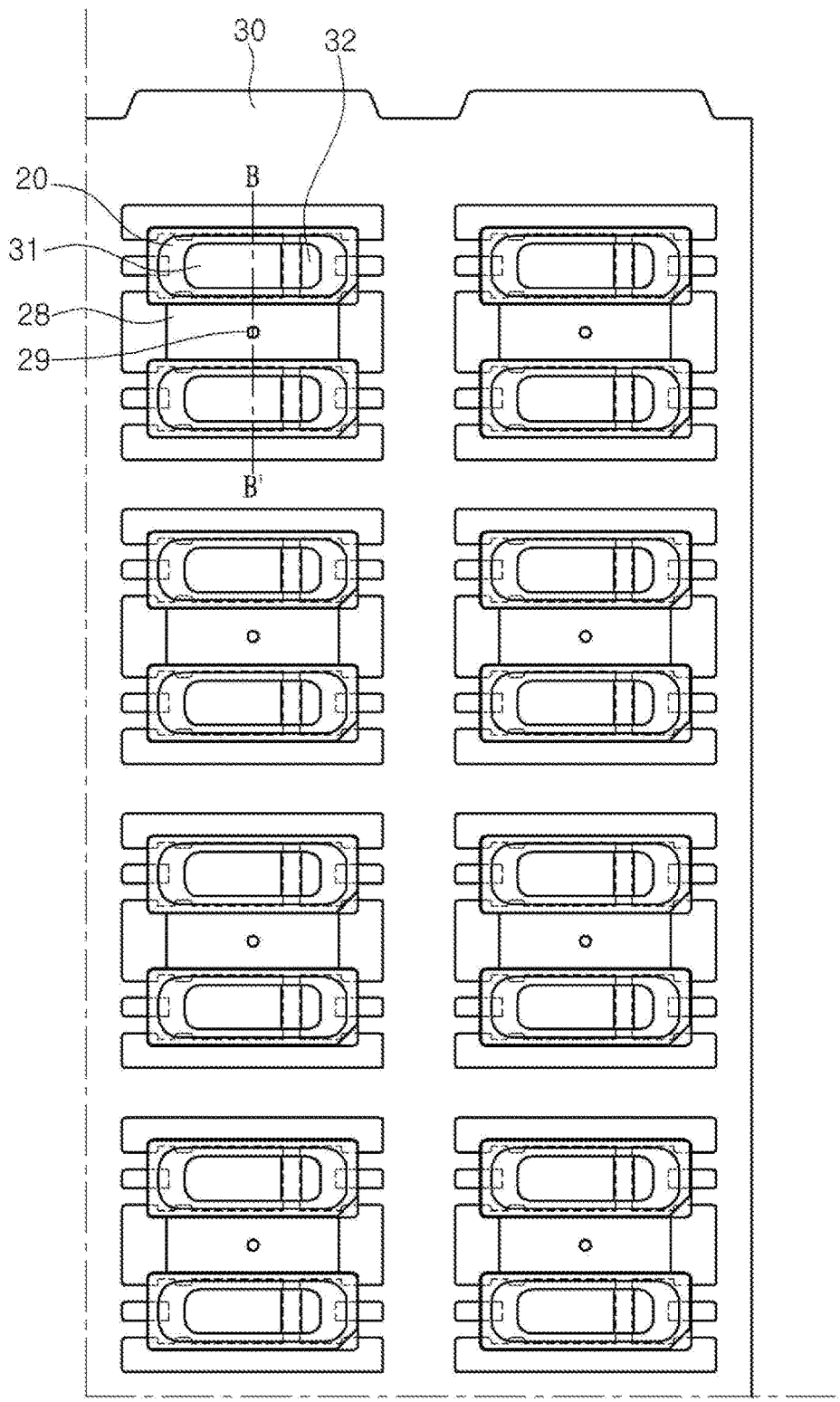

Second, referring to FIG. 8, after providing the electrode frame 30 on a cast having a shape of a plurality of bodies 20, material forming the body 20 is injected through an injection hole of the cast, thereby forming the bodies 20 (see step S102 of FIG. 11).

FIGS. 9A to 9C are views showing the processes of forming the body 20.

Hereinafter, the method of manufacturing the body 20 will be described in more detail with reference to FIG. 9A to 9C.

Referring to FIG. 9A, the electrode frame 30 is provided on casts 100 and 200. The cast 100 and 200 may include the first cast 200 corresponding to the shape of a lower portion of the body 20 and the second cast 100 corresponding to the shape of an upper portion of the body 20.

At least one of the first and second frames 200 and 100 may include injection holes 110 used to inject material forming the body 20. In this case, the injection holes 110 may be formed between the shapes of the bodies 20.

For example, as shown in FIGS. 9A to 9B, each injection hole 110 may be formed between at least two bodies. The position of such an injection hole 110 enables at least two bodies 20 to be simultaneously integrated with each other.

Then, referring to FIG. 9B, material forming the body 20 may be injected through the injection hole 110. For example, the material forming the body 20 may include resin material such as PPA, but the embodiment is not limited thereto.

Referring to FIG. 9C, after hardening the material forming the body 20, the first frame 200 is separated from the second frame 100, and the bodies 20 can be provided As shown in FIG. 8 and FIG. 9C, a connection part 28 may be formed between at least two bodies 20 that are simultaneously integrated with each other, and a mark 29 of the injection hole 110 may be formed at the central portion of the connection part 28.

As described above, since at least two bodies 20 are simultaneously formed by one injection hole 110 in the method of manufacturing the light emitting device 1 according to the embodiment, the efficiency of the manufacturing process can be improved.

Third, referring to FIGS. 8 and 10, the light emitting chip 10 is mounted on one of the first and second electrodes 31 and 32 (see step S103 of FIG. 11), and the light emitting chip 10 may be electrically connected to the first and second electrodes 31 and 32 through wire bonding (see step S104 of FIG. 11).

Four, the encapsulant 40 may be formed in the cavity 15 of the body 20 to seal and protect the light emitting chip 10 (see step S105 of FIG. 11).

Fifth, the light emitting devices 1 may be separated from each other in the unit of an individual device through a cutting process (see step S106 of FIG. 11).

In other words, according to the cutting process, at least two light emitting devices integrated with each other in the previous process may be separated from each other in the unit of an individual device.

In detail, the cutting process may include a process of separating the first and second electrodes 31 and 32 from the electrode fame 30 and a process of separating at least two integrated bodies 20 from each other.

Particularly, as shown in FIG. 10, in the process of separating at least two integrated bodies 20 from each other, the roughness 25 may be formed on at least one lateral surface of the body 20. In other words, the roughness 25 refers to a rough surface formed when the connection part 128 is removed through the cutting process.

The cutting process may be physically performed by using a cutter, but the embodiment is not limited thereto.

Meanwhile, the manufacturing process of the light emitting device 1 may be performed in the inverse sequence, but the sequence of the manufacturing process is not limited. For example, after the cutting process has been primarily performed, a process of installing the light emitting chip may be performed.

Hereinafter, another embodiment of the first and second electrodes of FIG. 1 will be described in detail.

Figure 12:
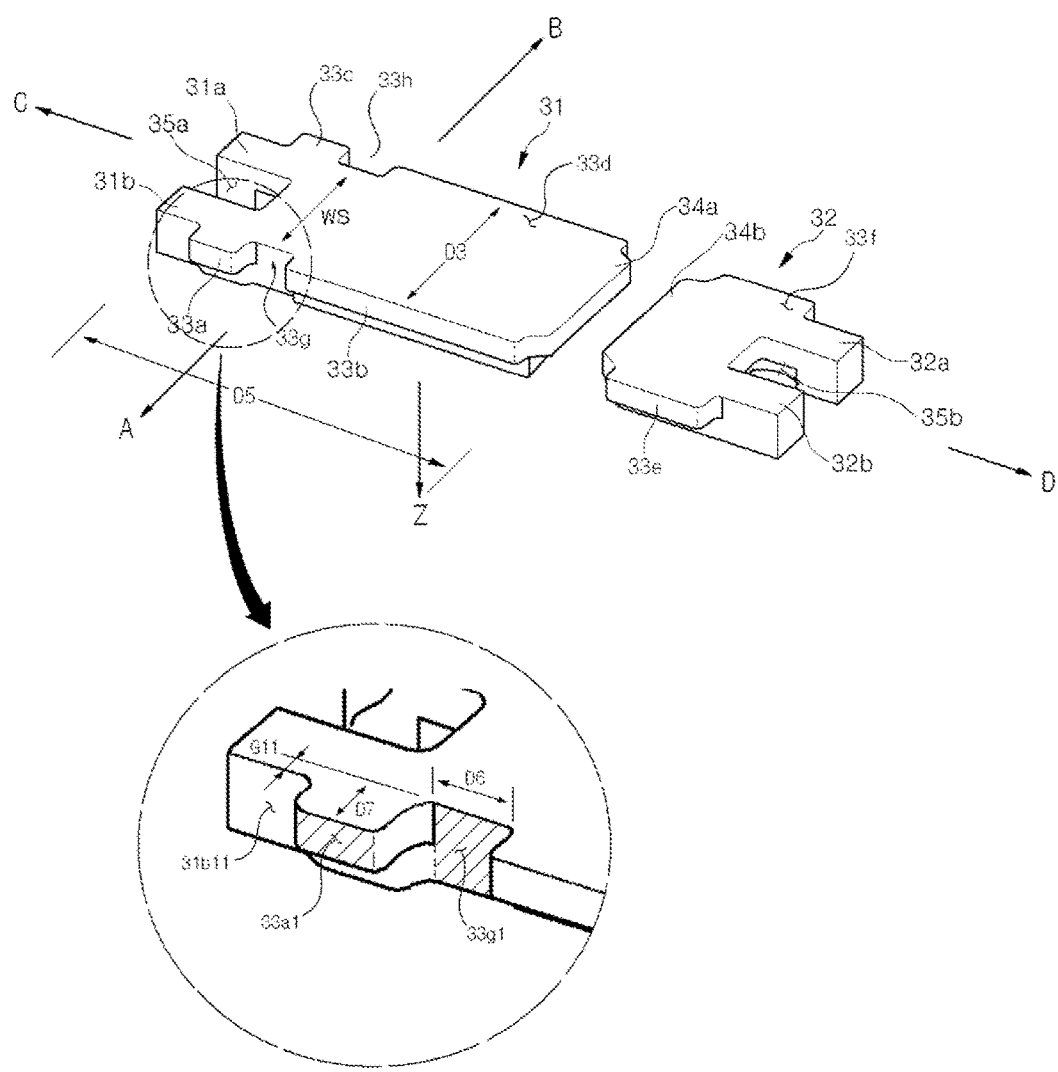
FIG. 12 is a top perspective view showing the first and second electrodes.

FIG. 12 is a top perspective view showing the first and second electrodes 31 and 32 in detail.

Hereinafter, the first and second electrodes 31 and 32 of FIG. 12 will be described while focusing on the difference from the first and second electrodes 31 and 32 of FIG. 5 because the first and second electrodes 31 and 32 of FIG. 12 are partially similar to the first and second electrodes 31 and 32 of FIG. 5.

The terminals of the first and second electrodes 31 and 32 exposed out of the body 20 are branched into the sub electrodes 31a and 31b and the sub electrodes 32a and 32b, respectively.

In other words, the terminal of the first electrode 31 is branched into the two first sub electrodes 31a and 31b, and the terminal of the second electrode 32 is branched into the two sub electrodes 32a and 32b.

In addition, a coupling region 35a is formed between two first sub electrodes 31a and 31b, so that the body 20 can be solidly coupled with the first sub electrodes 31a and 31b. When the body 20 including the first and second electrodes 31 and 32 is formed, the coupling region 35a may be formed by infiltrating material constituting the body 20 into the space between the first sub electrodes 31a and 31b. If the body 20 includes metallic material or substrate material instead of resin material, the coupling region 35a allows a portion of the body 20 to be inserted into the space between the first sub electrodes 31a and 31b, so that the first electrode 31 can be prevented from being separated from the body 20.

In addition, on a contact surface between the coupling region 35a and the first sub electrodes 31a and 31b, an inclined surface may be formed, or a step difference is formed by the inclined surface. In addition, the contact surface may be curved.

Similarly to the first electrode 31, the second electrode 32 may have a coupling region 35b between two sub electrodes 32a and 32b branching from the terminal of the second electrode 32. The second electrode 32 may be firmly fixed onto the body 20 by the coupling region 35b.

Coupling pins 33a to 33f may be formed on at least one lateral surface of the first and second electrodes 31 and 32.

The coupling pins 33a to 33f form a step difference from lower portions of the first and second electrodes 31 and 32. Accordingly, a region in which the widths of the top surfaces of the first and second electrodes 31 and 32 may be greater than the widths of the bottom surfaces of the first and second electrodes 31 and 32 may be formed, and may have a section in the shape of T.

The facing lateral surfaces 34a and 34b of the first and second electrodes 31 and 32 may be inclined or may have a step structure.

As described above, the body 20 and the first and second electrodes 31 and 32 can be firmly coupled with each other by the coupling structure of the first and second electrodes 31 and 32.

Since the first and second electrodes 31 and 32 have the T-shape section in a width direction, when the first and second electrodes 31 and 32 are coupled with material forming the body 20, the material forming the body 20 prevents the top surface of the T-shape structure from moving in a direction of Z. In addition, since the coupling pins 33a to 33f protrude toward the molding material of the body 20, after the material of the body 20 is hardened, the first and second electrodes 31 and 32 cannot be easily separated from each other in directions C or D.

The area of the electrodes on which the light emitting chip 10 is mounted is not reduced due to the T-shape structure, and the whole sectional area is increased along a T-shape outer peripheral surface. Accordingly, the T-shape structure increases the whole sectional area of the electrodes as compared with the typical electrodes and having a rectangular shape. Accordingly, the increase of the sectional area can improve a heat dissipation characteristic of the light emitting chip 10.

In the first electrode 31, the coupling pins 33a to 33d protrude in a direction A or B, and may be formed in adjacent to coupling grooves 33g and 33h. In addition, the coupling pins 33a to 33d may be alternately aligned with the coupling grooves 33g and 33h. When the coupling pins 33a to 33d are alternately aligned with the coupling grooves 33g and 33h in the first electrode 31, the concavo-convex structure formed by the coupling pins 33a to 33d and the coupling grooves 33g and 33h in the first electrode 31 allows the first electrode 31 to be firmly coupled with the molding material of the body 20.

Although FIG. 12 shows that the coupling pins 33a to 33d are arranged in adjacent to the coupling grooves 33g and 33h, the coupling pins 33a to 33d and the coupling grooves 33g and 33h may be alternately aligned with each other in the first electrode 31.

The coupling grooves 33g and 33h are recessed into the lateral surfaces of the sub electrodes 31a, 31b, 32a, and 32b protruding from the terminals of the first electrode 31 or the second electrode 32, and have a step difference from the exposed surfaces of the sub electrodes 31a, 31b, 32a, and 32b. Hereinafter, the coupling grooves and the sub electrodes will be described while focusing on reference numbers 33g and 31b.

As shown in FIG. 12, since the coupling groove 33g is formed by recessing a portion of an exposed surface 31b11 of the sub electrode 31b inward, the coupling groove 33g makes a step difference from a protruding surface 33a1 of the coupling pin 33a. The exposed surface 33g1 of the coupling groove 33g has a depth G11 from the exposed surface 31b11 of the sub electrode 31b. In other words, since the coupling groove 33g is formed in parallel to the exposed surface 31b11 of the sub electrode 31b and the protruding surface 33a1 of the coupling pin 33a and deeply recessed by the depth G11 from the exposed surface 31b11, the coupling groove 33g makes a greater step difference. The coupling groove 33g is filled with a greater amount of molding material of the body 20 due to the step difference. After the molding material has been hardened, the coupling groove 33g is more firmly coupled with the body 20.

The exposed surface 31b11 of the sub electrode 31b and the exposed surface of the coupling groove 33g preferably make a step sufficient difference only if the electrode 31b can be endured in strength. According to the present embodiment, the length G11 of the step difference may be in the range of about 0.01 mm to about 1 mm. However, preferably, the depth G11 in the first electrode 31 may correspond to about 10% to about 20% of a length D3 of the first electrode 31 in the width direction.

Meanwhile, as a width D6 of the exposed surface 33g1 of the coupling groove 33g in a longitudinal direction is lengthened, the contact surface between the exposed surface 33g1 and the molding material of the body 20 may be increased. The groove 33g may be more firmly coupled with the molding material of the body 20 by the increase of the contact surface between the exposed surface 33g1 and the molding material. However, if a width WS between the coupling grooves 33g and 33h has a great value, mechanical strength can be reduced in a region in which the width WS between the coupling grooves 33g and 33h is decreased. According to the present embodiment, the width D6 in the longitudinal direction may be in the range of about 0.15 mm to about 0.6 mm, and preferably corresponds to 10% to 16% of the width D5 of the first electrode 31 in the longitudinal direction.

The second electrode 32 is shorter than the first electrode 31. In order to firmly couple the second electrode 32 with the body 20, coupling holes can be additionally formed in the second electrode 32 adjacent to the coupling pines 33e and 33f by adjusting the sizes of the coupling pines 33e and 33f. At least one or two coupling grooves may be additionally formed in the second electrode 32, but the embodiment is not limited thereto.

In order to form the coupling grooves in the second electrode 32, preferably, a concavo-convex structure is formed at portions of the coupling pins 32e and 32 to form the coupling grooves for the second electrode 32, or the sizes of the coupling pins 32e and 32f may be reduced, and additional coupling grooves are formed in the adjacent to the coupling pins 32e and 32f.

When the coupling pins 33a and 33b formed in the first electrode 31 are formed in adjacent to the coupling groove 33g, since the material constituting the body 20 are filled along an outer peripheral surface of the coupling pins 33a and 33b and the coupling grooves 33g and hardened, and the coupling pins 33a and 33b are inserted into the hardened material of the body 20, the first electrode 31 may be very firmly coupled with the body 20. Similarly, the relation between the coupling pins 33c and 33d and the coupling groove 33h formed on the first electrode 31 is identical to the relation between the coupling pins 33a and 33b and the coupling groove 33g.

Figure 13:
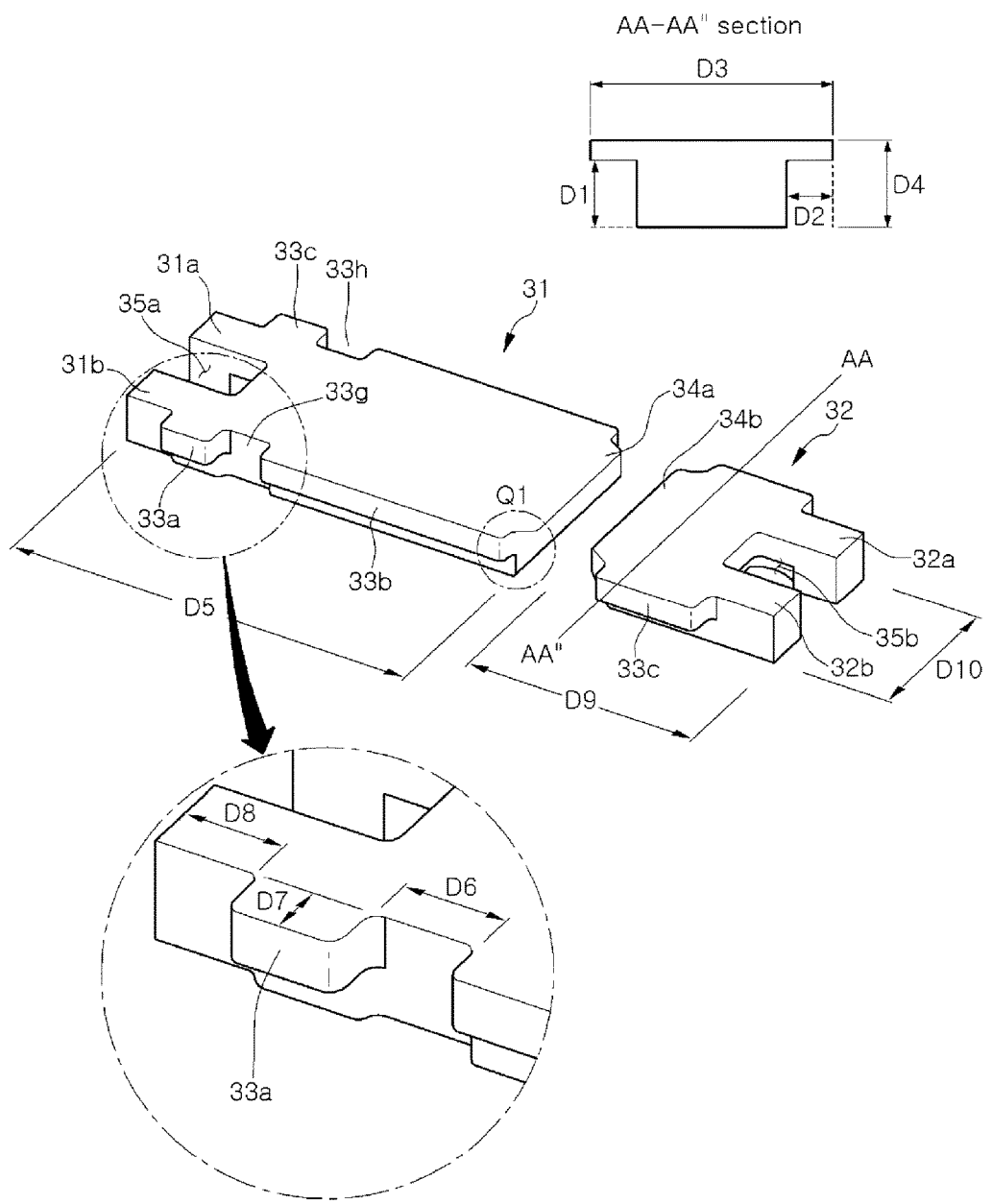
FIG. 13 is a view showing the dimension of the light emitting device of FIG. 1.

FIG. 13 shows one example for the dimension of the light emitting device shown in FIGS. 1 and 12.

Referring to FIG. 13, when the first and second electrodes 31 and 32 buried in the body 20 of the light emitting device are cut along line AA-AA" in the width direction, the first and second electrodes 31 and 32 have a T shape. The dimension obtained from the section and the perspective view of the T shape is represented as follows.

Length of D1: 0.15 mm,
Length of D2: 0.1 mm,
Length of D3: 1.16 mm,
Length of D4: 0.3 mm,
Length of D5: 2.4 mm,
Length of D6: 0.3 mm,
Length of D7: 0.11 mm,
Length of D8: 0.3 mm,
Length of D9: 1.0 mm, and
Length of D10: 0.94 mm.

The dimensions of D1 to D10 are given as an example for the light emitting device according to the disclosure, and the dimension of the light emitting device according to the disclosure is not limited thereto. The dimension of the light emitting device according to the disclosure may be changed in order to improve the easiness and the reliability for the use of the light emitting device, and the model and the manufacturing of the light emitting device.

Referring to the present drawing, the length D3 of the top surface of a T-shape section is 0.2 mm longer than the length of the bottom surface of the T-shape section, and a heat dissipation area may be more increased when the light emitting chip 10 is mounted.

In addition, since the length D3 of the top surface of a T-shape section is longer than the length of the bottom surface of the T-shape section, the electrode is supported by the body 20, so that the electrode can be firmly fixed onto the body 20.

As shown in the present drawing, the width D5 of the first electrode 31 in the longitudinal direction is longer than that of the second electrode 32. Accordingly, referring to the present drawing, the light emitting chip 10 may be preferably mounted on the first electrode 31 in which the heat dissipation area can be ensured. In this case, when external power is applied through the first and second electrodes 31 and 32, a zener diode (not shown) may be added to stabilize the voltage of external power. In this case, the zener diode (not shown) is preferably mounted on the second electrode 32.

D1 represents the length between the top surface and the bottom surface of the first electrode 31 or the second electrode 32 having a T shape.

D2 represents the protrusion length of the coupling pin 33d when the coupling pin 33d protrudes from the first electrode 31 or the second electrode 32.

D3 represents the length of the first electrode 31 or the second electrode 31 in the width direction.

D4 represents the thickness of the first electrode 31 or the second electrode 32, and D5 represents the length of the longer axis of the first electrode 31.

D6 represents the width of the bottom surface 33g1 of the coupling groove 33g in the longitudinal direction and may be in the range of about 0.15 mm to about 0.6 mm. The bottom surface 33g1 is buried by material of the body 20 when the outer appearance of the body 20 is formed. When the material of the body 20 is hardened, the bottom surface 33g1 may be firmly coupled with the body 20.

D7 represents the length between the protruding surface 33a1 of the coupling pin 33a, which protrudes with a length in the range of about 0.05 mm to about 0.22 mm from the bottom surface 33g1 of the coupling groove 33g, and the bottom surface 33g1. According to the present embodiment, D7 may be in the range of about 0.05 mm to about 0.22 mm. As the step difference between the protruding surface 33a1 of the coupling pin 33a and the bottom surface 33g1 is increased, an amount of material of the body 20 filled in the coupling groove 33g is increased. After the material of the body 20 has been hardened, since the coupling pin 33a is deeply inserted into the material of the body 20, the bonding strength among the coupling pin 33a, the coupling groove 33g, and the body 20 is increased.

D8 represents the distance between the terminal of the sub electrode 31b and the coupling pin 33a, and may be in the range of about 0.15 mm to about 0.6 mm.

D9 represents the length of the longer axis of the second electrode 32 and may be in the range of about 0.5 mm to about 2 mm.

D10 represents the dimension of the bottom surface of the T-shape section of the first electrode 31 or the second electrode 32, and is shorter than the length of the top surface of the T-shape section, so that the first electrode 31 or the second electrode 32 having the T shape can be supported and fixed onto the body 20.

Referring to FIG. 13, regions Q1 and Q2 represent corners of the first and second electrodes 31 and 32, respectively.

The regions Q1 and Q2 have the forms of gently recessed corners of the first and second electrodes 31 and 32, so that the curved surface of the regions Q1 and Q2 are coupled with the molding material.

Figure 14:
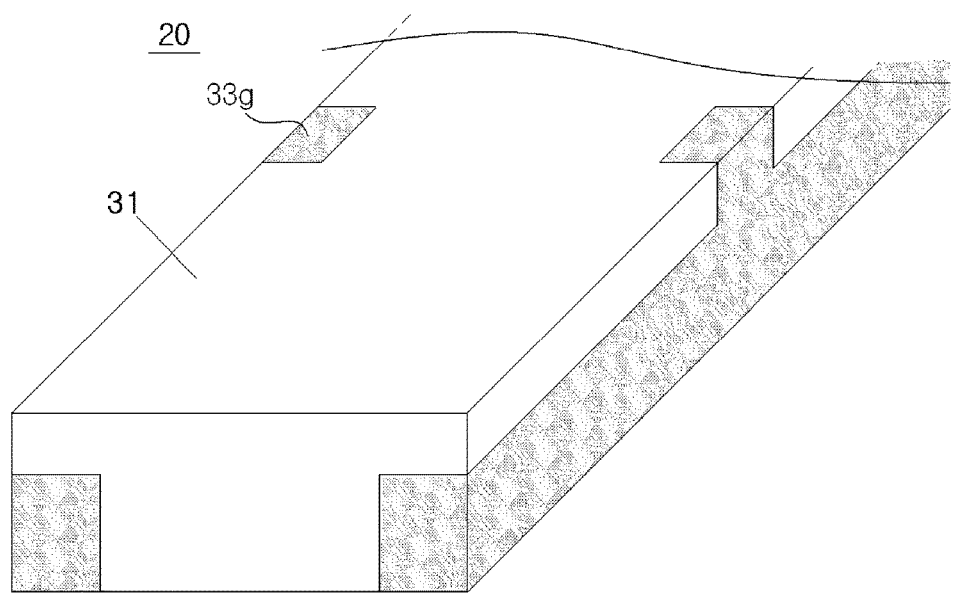
FIG. 14 is a view showing a scheme in which a body is coupled with an electrode (first electrode or second electrode)

FIG. 14 shows an example in which the body 20 is coupled with electrodes (the first electrode or the second electrode).

Referring to FIG. 14, after the material constituting the body 20 has been filled in the coupling groove 33g formed in the first electrode 31 (or the second electrode that is omitted hereinafter), the material of the body 20 is hardened, so that the body 20 is coupled with the first electrode 31 in a concavo-convex structure.

When the body 20 constitutes the light emitting device package, the molding material of the body 20 is filled in the coupling groove 33g forming a concavo-convex pattern on the lateral surface of the first electrode (or the second electrode). Thereafter, if the molding material is hardened, the hardened molding material is filled in the concavo-convex region formed by the first electrode 31 (or the second electrode) to form the outer appearance of the body 20. The body 20 is firmly coupled with the first electrode 31 (or the second electrode) through a concavo-convex structure coupling relation. In this case, if the outer appearance of the body 20 is spoiled when the molding material is hardened, a sanding process may be performed with respect to the body 20 to flatten the outer portion of the body 20.

FIGS. 15 to 18 show electrodes (that is, the first and second electrodes) according to first, second, and third embodiments.

Figure 15:
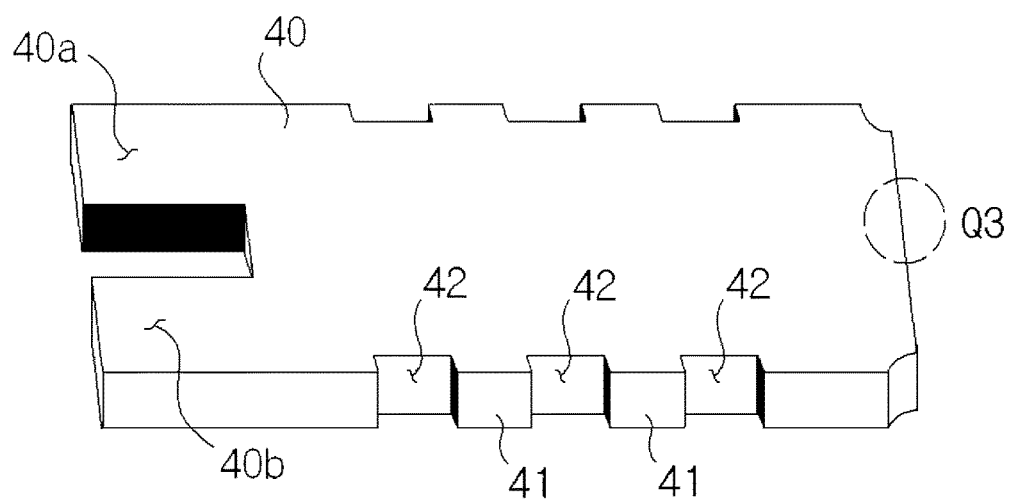
FIGS. 15 to 18 are views showing electrodes (first or second electrode) according to first, second, and third embodiments.

Referring to FIG. 15, coupling pins 41 and coupling grooves 42 are alternately aligned with each other on a lateral surface of an electrode 40. According to the embodiment, the coupling pins 41 are alternately aligned with the coupling grooves 42 on the lateral surface of the electrode 40 in such a manner that the coupling pins 41 protrude into the molding material of the body 20 and fixed into the body 20, and the molding material of the body 20 is filled in the coupling groove 42 and firmly coupled with the coupling groove 42 when the molding material is hardened.

Although the coupling pins 41 and the coupling grooves 42 are formed at both lateral surfaces of the electrode 40 through the drawing and the description, the coupling pins 41 and the coupling grooves 42 may be formed even in a head region Q3 of the electrode 40. At least two or three coupling pins 41 and coupling grooves 42 may be formed.

The electrode of FIG. 15 may be one of the first and second electrodes 31 and 32 described with reference to FIGS. 1 to 14, and the above electrodes will be not separately distinguished among them for the purpose of explanation.

As shown in FIG. 15, reference numbers 40a and 40b represent sub electrodes exposed out of the body 20. The sub electrodes 40a and 40b may be formed in parallel to the electrode 40, or the terminals of the sub electrodes 40a and 40b may be bent downward. Although the present embodiment has been described in that the terminal of the electrode 40 is branched into two sub electrodes 40a and 40b, the sub electrodes 40a and 40b may not be branched.

The electrode 40 may include one of the first electrode 31 or the second electrode 32 of FIG. 5. If the first and second electrodes 31 and 32 of FIG. 12 have the shape according to the present embodiment, the head regions Q3 of a pair of electrodes are provided in the body 20 while facing each other, and the molding material of the body 20 is filled in the space between the two electrodes 31 and 32, so that the two electrodes 31 and 32 may be fixed in a state in which two electrodes are spaced apart from each other.

Figure 16:
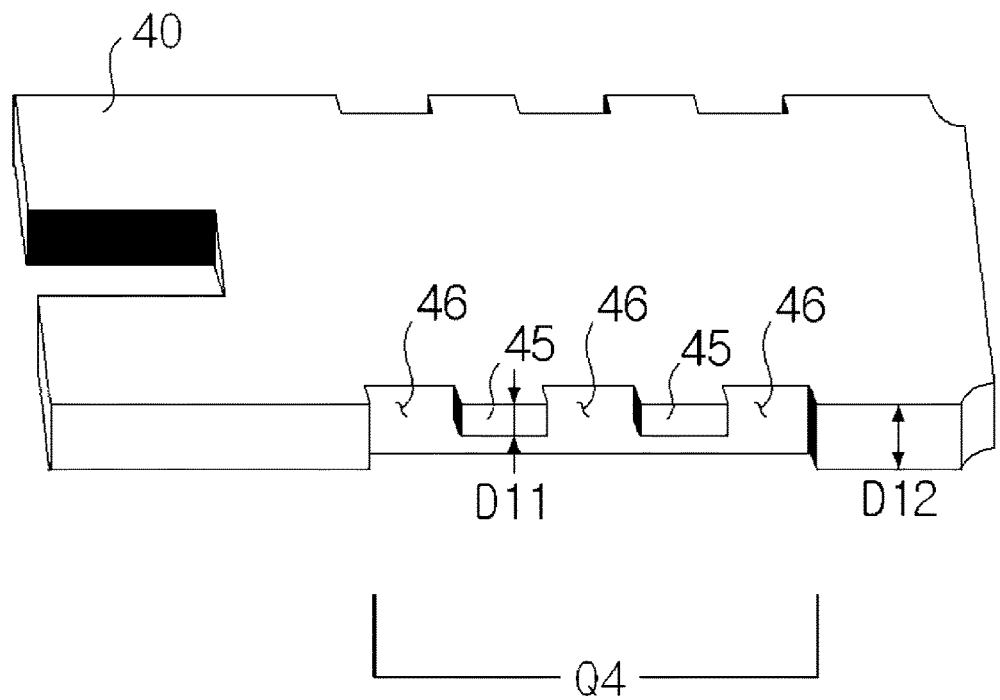

Referring to FIG. 16, the coupling pin 45 and the coupling groove 46 have the structure similar to the structure of the pins and grooves of FIG. 15 except that the thickness D11 of the coupling pin 45 is thinner than the thickness D12 of the first electrode 31, so that the electrode 40 can be more firmly fixed onto the body 20. Referring to FIG. 16, the molding material of the body 20 is filled under the coupling pin 45 and filled in the coupling groove 46. When the molding material of the coupling pin 45 is filled under the coupling pin 45, the section of the electrode 40 for the region Q4 of the electrode 40 having the coupling pins 45 and the coupling groove 46 forms the T shape, and the electrode 40 is supported by the body 20 after the molding material has been hardened. In this case, since the terminal of the coupling pin 45 is parallel to the outer peripheral surface of the body, the terminal is not exposed out of the electrode 40.

Since the coupling pin 45 having a T shape is not exposed out of the outer peripheral surface of the first electrode 31 in the above structure, the coupling pin 45 can be prevented from being damaged or deformed due to external force.

Figure 17:
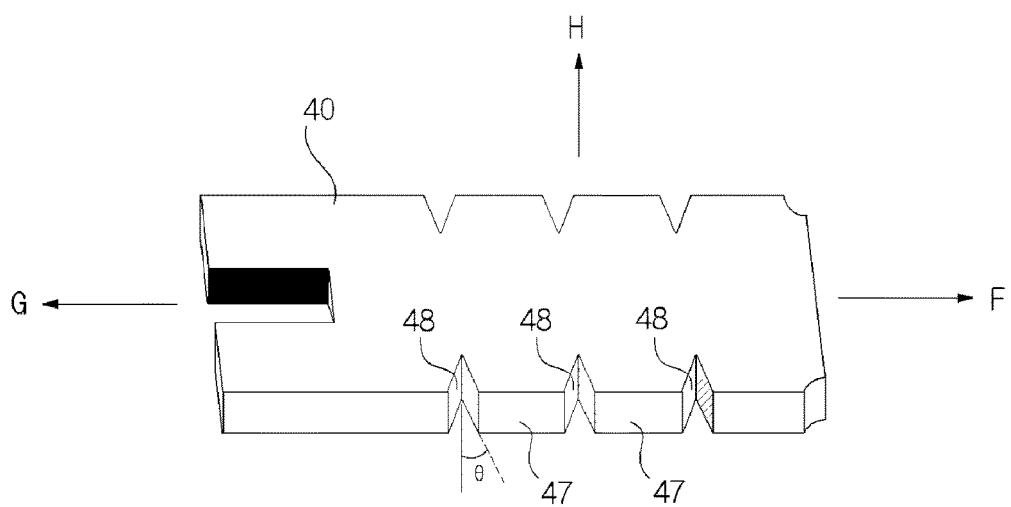

Referring to FIG. 17, coupling pins 47 protrude in the form of the trapezoid from the electrode 40, and coupling grooves 48 having a triangular shape are alternately aligned with the coupling pins 47. Since the coupling groove 48 has a triangular shape deeply recessed inward from the electrode 40, an angle θ of the coupling groove 48 forms an acute angle with respect to the vertex of the triangle. After the molding material has been filled in the coupling groove 48 having an acute angle and hardened, the electrode 40 has strong resistance against directions F and G. In other words, since the electrode 40 is not easily separated in the direction F or G, and the coupling pin 47 has resistance against a direction H or a direction inverse to the direction H by an angle of 180 degrees, the electrode 40 is firmly fixed onto the body 20.

As shown in FIG. 17, the coupling pins 47 and the coupling grooves 48 are formed along the lateral surface of the electrode 40. However, the coupling pins 47 and the coupling grooves 48 may be formed in the direction F of the electrode 40. At least one coupling pin 47 and at least one coupling groove 48 may be formed. At least two coupling pins 47 and at least two coupling pins 48 may be formed.

Although not shown, the coupling pin 47 may have a thickness different from the thickness of the electrode 40, so that the coupling pin 47 and the electrode 40 may have a step difference structure. If the coupling pin 47 and the electrode 40 have the step difference structure, the electrode 47 is supported by the molding material of the body 20, so that the electrode 47 is more firmly coupled with the body 20.

Figure 18:
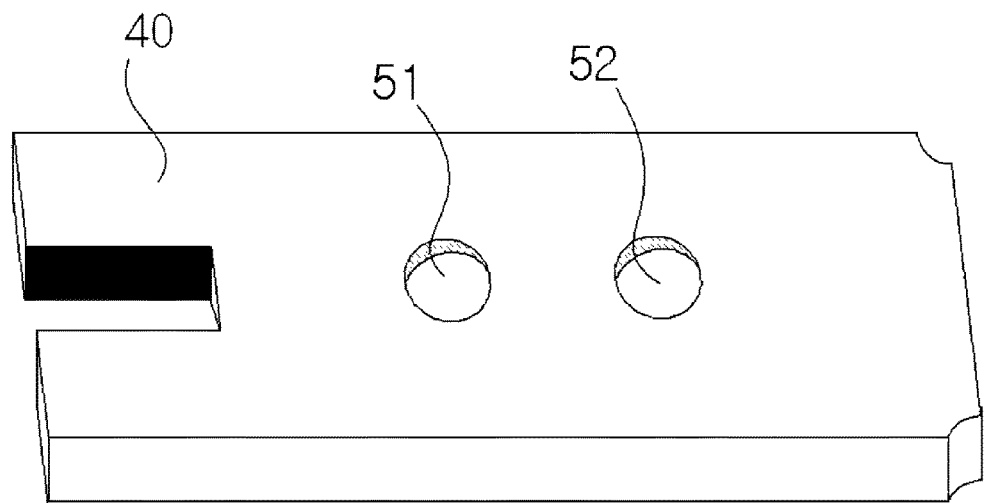

Referring to FIG. 18, protrusions or recesses are not formed on the electrode 40, but two holes 51 and 52 are formed in the electrode 40 in a surface direction.

The holes 51 and 52 pass completely through the electrode 40. After the molding material infiltrates through the holes 51 and 52 and is hardened, the electrode 40 is firmly fixed onto the body 20 by the hardened molding material. Although FIG. 18 shows the holes 51 and 52 having circular shapes, the holes 51 and 52 may be realized in a circular shape, an oval shape, a triangular shape, a rectangular shape, and a polygonal shape.

Two holes 51 and 52, three holes 51 and 52 or more are formed in the electrode 40 to increase the bonding strength between the electrode 40 and the body 20. The electrode 40 according to the present embodiment has a very simple coupling structure with the body 20, so that the reliability and stability can be obtained due to the simplicity of the structure.

Figure 19:
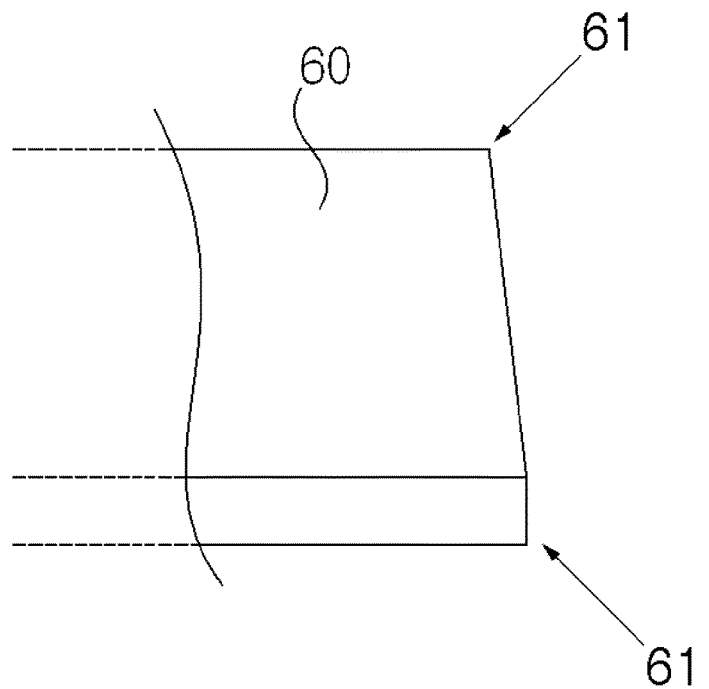
FIGS. 19 to 21 are views showing corner regions of an electrode (first or second electrode) according to one embodiment of the disclosure.
Figure 20:
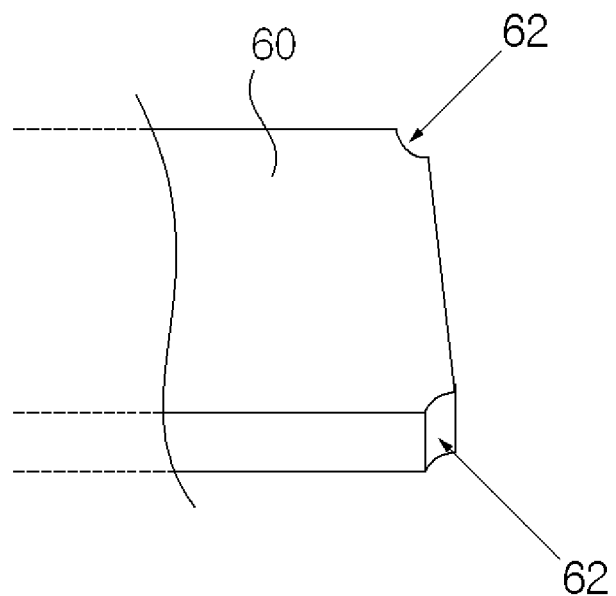
Figure 21:
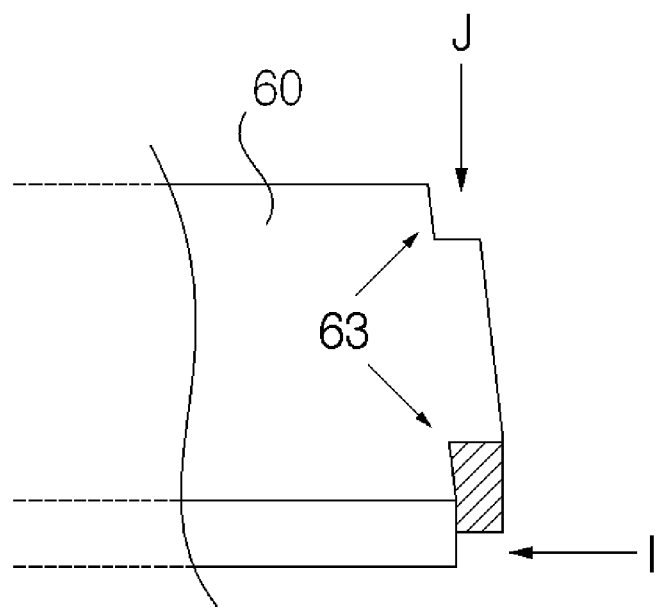

FIGS. 19 to 21 show corners of the electrode (first electrode or second electrode) according to various embodiments of the disclosure.

Referring to FIG. 19, a corner region 61 has a rectangular shape. When the corner region 61 has the rectangular shape, the electrode 60 is simply manufactured, and the whole structure of the light emitting device can be simplified.

Referring to FIG. 20, a corner region 62 may have a curved surface recessed inward from the electrode 60. When the corner region 62 has a curved surface recessed inward from the electrode 60, the area of the corner region 62 is increased due to the curved surface. Accordingly, when packaging is performed by using molding material, the contact surface between the corner region 62 and the molding material may be increased. As the contact area is increased, the friction between the corner region 62 of the electrode 60 and the molding material is increased. Accordingly, after the molding material fixes the electrode 60, the electrode 60 may be firmly coupled with the molding material.

Thereafter, referring to FIG. 21, a corner region 63 is recessed in a rectangular shape, and may have resistance against directions I and J. For example, when the electrode 60 moves in a direction opposite to the direction I, the molding material has resistance against the direction I, so that the movement of the electrode 60 can be blocked. In addition, when the electrode 60 moves in the direction opposite to the direction J, the molding material has resistance against the direction J, so that the movement of the first electrode 31 is blocked. Similarly, although not shown, the recess having the rectangular shape is formed at the left of the electrode 60, and the electrode 60 is blocked from being moved in the directions I and J and the directions opposite to the directions I and J by the corner regions 63 formed symmetrically to each other at the left and right of the electrode 60.

The corner region 6 formed in the right of the electrode 60 is identically formed in the left of the electrode 60, which is not shown in FIG. 21, such that the corner regions are symmetrical to each other. Such symmetry may be applied to the embodiments of FIGS. 19 and 20.

Figure 22:
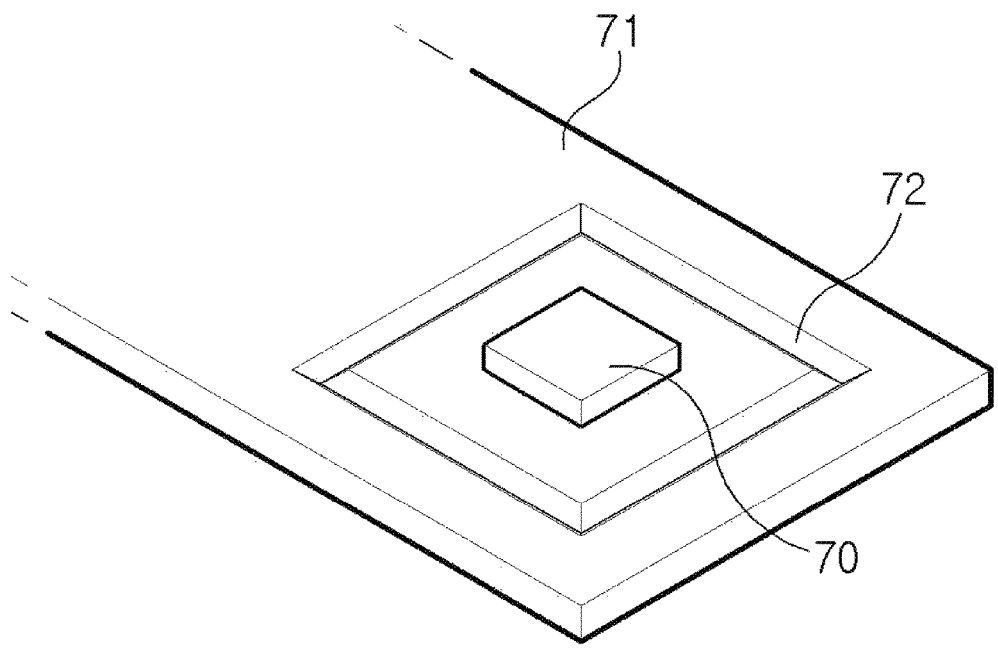
FIG. 22 shows an electrode structure of a light emitting device according to another embodiment of the present invention.
Figure 23:
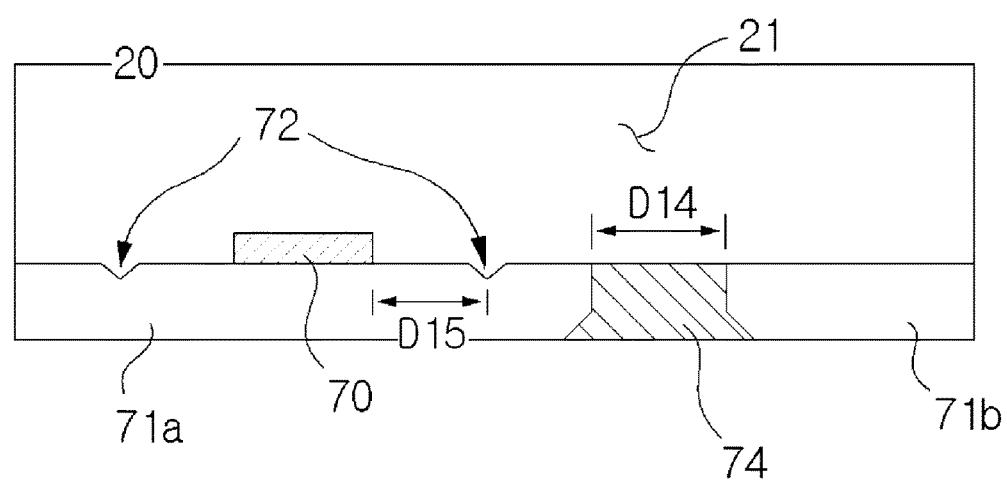
FIG. 23 shows an example in which an electrode is coupled with a body according to one embodiment.

FIG. 22 shows an electrode structure of a light emitting device according to another embodiment of the present invention, and FIG. 23 shows an example in which the electrode of FIG. 22 is coupled with a body.

Referring to FIGS. 22 and 23, a guide groove 72 is formed in an electrode 71 on which a light emitting chip 70 is mounted, and formed around a light emitting chip 70 along the outer peripheral portion of the light emitting chip 70. The guide groove 72 is formed by recessing the surface of the electrode 71 corresponding to the outer peripheral portion of the light emitting chip 70. The groove formed in the surface of the electrode 71 may have a circular shape, a rectangular shape, a triangular shape, and polygonal shapes along the outer peripheral surface of the light emitting chip 70.

Since the guide groove 72 is recessed in the surface of the electrode 71, the section of the guide groove 71, that is, the section of the electrode having the groove may have a circular shape, a rectangular shape, a triangular shape, or a polygonal shape. FIG. 17 shows an example in which the section of the groove has a triangular shape.

The guide groove 72 is spaced apart from one side of the outer peripheral surface of the light emitting chip 70 at a distance D15. The guide groove 72 makes the access path of the foreign matters, which infiltrate through the protective cap 74, in the shape of V and increases the access path if the molding material of the body has infiltrated and hardened, thereby blocking the foreign matters from accessing the light emitting chip 70.

The first electrode 71 includes a first electrode 71a and a second electrode 72b to supply power to the light emitting chip 70. Since the first and second electrodes 71a and 71b supply one of a positive voltage (+) and a negative voltage (−), the first and second electrodes 71a and 71b need to be electrically insulated from each other. Accordingly, the first and second electrodes 71a and 71b are spaced apart from each other at the distance D14. Preferably, the distance D14 has a range of about 0.1 mm to about 2 mm, and the range may be increased or decreased according to the voltage or the quantity of current consumed in the light emitting chip 70. When the first electrode 71a is spaced apart from the second electrode 71b, the protective cap 74 provided in the space between the first and second electrodes 71a and 71b can prevent foreign matters, such as dust, moisture, and others, from infiltrating to the space between the first and second electrodes 71a and the second electrode 71b through the lower portion of the body as much as possible. The protective cap 74 has a narrower top surface and a wider bottom surface. An oblique path from the bottom surface to the top surface is formed, so that the infiltration path of foreign matters between the first and second electrodes 71a and 71b can be maximized.

However, even if the infiltration of the foreign matters is minimized by using the structure, the foreign matters may infiltrate into a sealed region by the protective cap 74. When the foreign matters introduced into the sealed region move toward the light emitting chip 70, the access of the foreign matters is again blocked by the guide groove 72 at the outer peripheral portion of the light emitting chip 70. Accordingly, the foreign matters cannot infiltrate into the light emitting chip 70 or through the outer peripheral portion of the light emitting chip 70.

Figure 24:
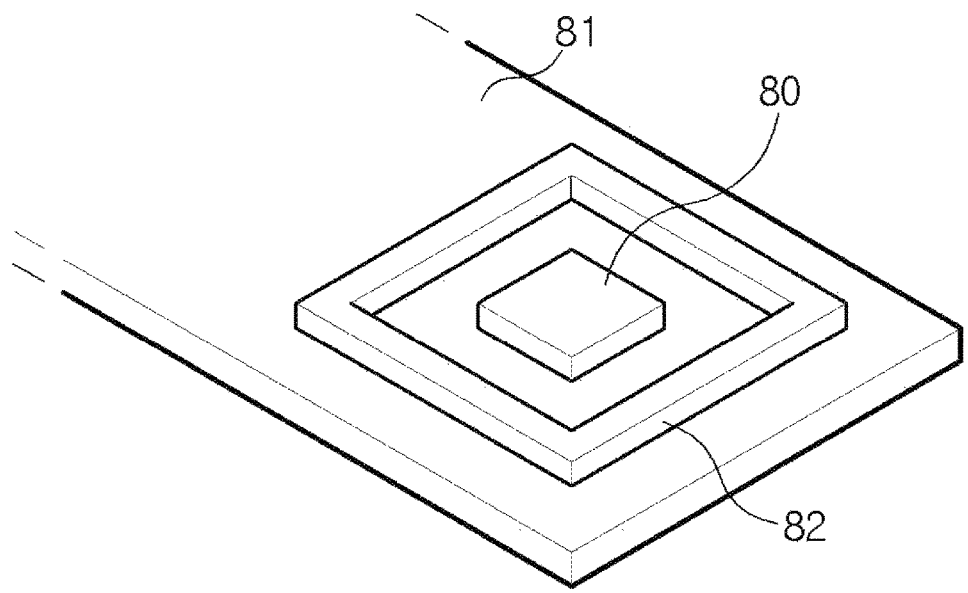
FIG. 24 is a view showing an electrode according to still another embodiment of the disclosure.
Figure 25:
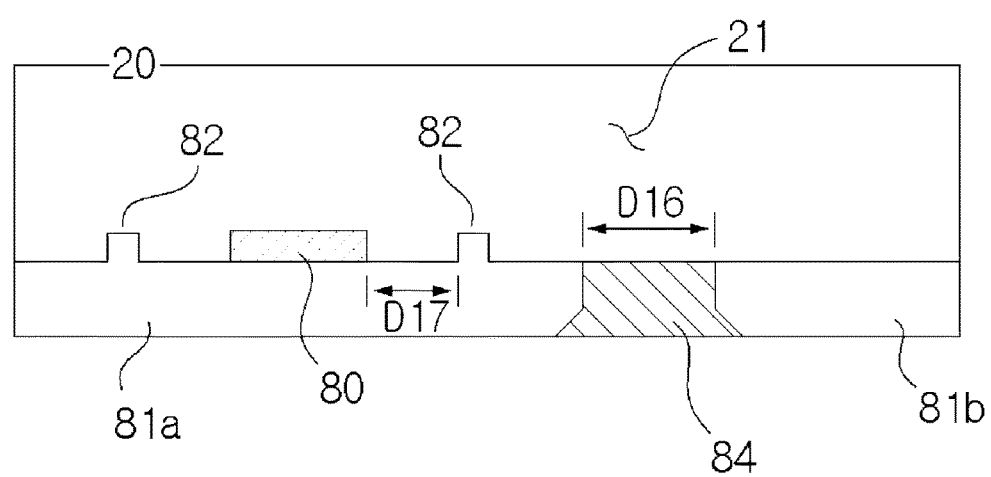
FIG. 25 is a view showing one example in which a body is coupled with an electrode.

FIG. 24 is a view showing an electrode according to another embodiment of the disclosure, and FIG. 25 is a view showing an example in which a body is coupled with an electrode.

Referring to FIGS. 24 and 25, a guide 82 is formed in an electrode 81 on which a light emitting chip 80 is mounted, and formed around the light emitting chip 80 along an outer peripheral surface of the light emitting chip 80. The guide 82 protrudes to a top surface of the electrode 81. When a region of the electrode 81 in which the guide 82 is formed is cut, the cut surface has a structure in which a protrusion having a triangular shape, a rectangular shape, a semicircular shape, or other polygonal shapes projects from the surface of the electrode 81. As shown in FIG. 24, the rectangular protrusion corresponds to the guide 82.

The guide 82 may have one of a rectangular shape, a circular shape, a triangular shape, and other polygonal shapes formed around the light emitting chip 80. In this case, the guide 82 need not have a symmetric structure about the light emitting chip 80.

If necessary, one side of the guide 82 may be closer to the central point of the light emitting chip 80, and an opposite side of the guide 82 may be further away from the central point of the light emitting chip 80.

The electrode 81 includes a first electrode 81a and a second electrode 81b to supply power to the light emitting chip 80, and the first and second electrodes 81a and 81b are spaced apart from each other at the distance D16 to prevent the first and second electrodes 81a and 81b from being electrically shorted.

Preferably, the distance D16 may be in the range of about 0.1 mm to about 2 mm, and the range may be changed according to the quantity of current or voltage consumed in the light emitting chip 80.

The guide 82 is spaced apart from the light emitting chip 80 at a predetermined distance D17, and protrudes into the molding material 21 constituting the body 20 so that a wall can be formed around the light emitting chip 80. The guide 82 prevents foreign matters from moving from the light emitting chip 80 when the foreign matters infiltrate into the sealed region of the protective cap 84 to move toward the light emitting chip 80. As the height of the guide 82 is increased, the resistance against the foreign matters is increased. However, since the light emission efficiency from the light emitting chip 80 is reduced as the height of the guide 82 is increased, the height of the guide 82 is preferably set to a value identical to or lower than that of the light emitting chip 80.

The protective cap 84 primarily prevents external foreign matters from infiltrating into the light emitting chip 80 by sealing the space between the first and second electrodes 81a and 81b. Top and bottom surfaces of the protective cap 84 are arranged in line with top and bottom surfaces of the first and second electrodes 81a and 81b, respectively.

Although FIG. 25 shows that the top surface of the protective cap 84 is in line with the top surface of the electrode 81, the top surface of the protective cap 84 additionally extends to the first and second electrodes 81a and 81b, so that the protective cap 84 may have a cap shape. In this case, the protective cap 84 may have higher resistance against the infiltration of the external foreign matters.

When the top surface of the protective cap 84 extends the direction of the top surface of the first and second electrodes 81a and 81b, the shape of the protective chap 84 may be identical to that of the protective cap 27 of FIG. 4.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed:

1. A light emitting device, comprising:
   a body having a first length in a first direction and a second length in a second direction perpendicular to the first direction;
   a first electrode having a top surface and a bottom surface in the body;
   a second electrode separated from the first electrode and having a top surface and a bottom surface in the body;
   at least one light emitting chip disposed on at least one of the first electrode or the second electrode, the at least one light emitting chip electrically connected to the first electrode by at least one wire, and the at least one light emitting chip electrically connected to the second electrode by at least one wire; and
   a spacer between the first electrode and the second electrode,
   wherein the first electrode and the second electrode each includes two end portions separated from each other in the second direction,
   wherein at least one of the first electrode or the second electrode includes at least two passing through holes,
   wherein the first electrode and the second electrode include a recess between the two end portions, respectively,
   wherein the recess is disposed in the body,
   wherein each length of the two end portions of the first electrode in the first direction is greater than 10% of a length of the top surface of the first electrode in the first direction.

2. The light emitting device of claim 1, wherein a top surface of the spacer is protruded above the top surface of the first electrode.

3. The light emitting device of claim 2, wherein the spacer is filled by the body such that a bottom surface of the body is flush with the bottom surfaces of the first electrode and the second electrode.

4. The light emitting device of claim 3, wherein the spacer includes a first portion and a second portion on the first portion, and a length of the first portion in the first direction is different from a length of the second portion in the first direction.

5. The light emitting device of claim 4, wherein the length of the second portion is less than a length of the at least one light emitting chip.

6. The light emitting device of claim 1, wherein each length, in the first direction, of the two end portions of the first electrode is the same, and each length, in the first direction, of the two end portions of the second electrode is the same.

7. The light emitting device of claim 1, wherein the first electrode and the second electrode have a curved surface at a plurality of corner regions,
wherein the recess of the first electrode includes at least one rounded corner.

8. The light emitting device of claim 1, wherein a length of the top surface of the first electrode in the second direction is at least 1.2 times greater than a length of the bottom surface of the first electrode in the second direction.

9. A light emitting device, comprising:
a body having a first length in a first direction and a second length in a second direction perpendicular to the first direction;
a first electrode having a top surface and a bottom surface in the body;
a second electrode separated from the first electrode;
at least one light emitting chip disposed on at least one of the first electrode or the second electrode, the at least one light emitting chip electrically connected to both of the first electrode and the second electrode; and
a spacer disposed between the first electrode and the second electrode,
wherein the first electrode comprises a first protrusion protruding in the second direction from a first lateral side and a second protrusion protruding in an opposite direction to the second direction from a second lateral side, the second lateral side being on an opposite side of the first electrode from the first lateral side,
wherein the first electrode includes two end portions separated from each other in the second direction, and a recess with a curvature between the two end portions of the first electrode,
wherein the recess is disposed in the body, and
wherein a length of the top surface of the first electrode in the second direction is at least 1.2 times greater than a length of the bottom surface of the first electrode in the second direction.

10. The light emitting device of claim 9, wherein at least one of the first electrode or the second electrode has a curved surface at a plurality of corner regions.

11. The light emitting device of claim 10, wherein a length of the first protrusion in the second direction is greater than 10% of a length of the bottom surface of the first electrode in the second direction.

12. The light emitting device of claim 9, wherein each length, in the first direction, of the two end portions of the first electrode in the first direction is the same, and each length, in the first direction, of the two end portions of the second electrode is the same.

13. The light emitting device of claim 9, wherein each length, in the first direction, of the two end portions of the first electrode is greater than 10% of a length of the top surface of the first electrode in the first direction.

14. The light emitting device of claim 9, wherein the recess of the first electrode includes at least one rounded corner.

15. The light emitting device of claim 9, wherein the second electrode includes a third protrusion that protrudes in the second direction from a third lateral side and a fourth protrusion that protrudes in an opposite direction to the second direction from a fourth lateral side, and
wherein a length of the third protrusion is greater than 10% of a length of the bottom surface of the second electrode in the second direction.

16. The light emitting device of claim 15, wherein at least one of side edges of the first, second, third and fourth protrusions is exposed through the body.

17. A light emitting device, comprising:
a body having a first length in a first direction and a second length in a second direction perpendicular to the first direction;
a first electrode having a top surface and a bottom surface in the body;
a second electrode separated from the first electrode and having a top surface and a bottom surface in the body;
at least one light emitting chip disposed on at least one of the first electrode or the second electrode, the at least one light emitting chip electrically connected to the first electrode by at least one wire, and the at least one light emitting chip electrically connected to the second electrode by at least one wire; and
a spacer disposed between the first electrode and the second electrode,
wherein the first electrode and the second electrode each include two end portions separated from each other in the second direction,
wherein the first electrode includes at least two passing through holes,
wherein the first electrode or the second electrode has a curved surface at a plurality of corner regions,
wherein the first electrode and the second electrode include a recess between the two end portions, respectively,
wherein each length of the two end portions of the first electrode in the first direction is greater than 10% of a length of the top surface of the first electrode in the first direction, and
wherein the at least two passing through holes are not overlapped with the two end portions of the first electrode in the second direction.

18. The light emitting device of claim 17, wherein the first electrode comprises a first protrusion protruding in the second direction from a first lateral side and a second protrusion protruding in an opposite direction to the second direction from a second lateral side, the second lateral side being on an opposite side of the first electrode from the first lateral side,
wherein the first electrode has a T shape cut section along the second direction, and
wherein a length of the first protrusion in the second direction is greater than 10% of a length of the bottom surface of the first electrode in the second direction.

19. The light emitting device of claim 18, wherein the second electrode includes a third protrusion that protrudes in the second direction from a third lateral side and a fourth protrusion that protrudes in an opposite direction to the second direction from a fourth lateral side, the fourth lateral side being on an opposite side of the second electrode from the third lateral side,
wherein the second electrode has a T shape cut section along the second direction, and wherein a length of the third protrusion in the second direction is greater than 10% of a length of the bottom surface of the second electrode in the second direction.

20. The light emitting device of claim 19, wherein at least one of side edges of the first, second, third and fourth protrusions is exposed through the body.

21. The light emitting device of claim 17, wherein the at least two passing through holes are not overlapped with the at least one light emitting chip,
   wherein the first electrode has a T shape cut section along the second direction, and
   wherein the second electrode has a T shape cut section along the second direction.

22. The light emitting device of claim 17, wherein the two end portions of the first electrode are overlapped with each other in the second direction, and
   wherein each length, in the first direction, of the two end portions of the first electrode is the same, and each length, in the first direction, of the two end portions of the second electrode is the same.

23. The light emitting device of claim 17, wherein the recess is disposed in the body, and
   wherein the recess includes a curvature between the two end portions, respectively.

24. The light emitting device of claim 17, wherein the spacer includes a first portion and a second portion on the first portion, and
   a length of the first portion in the first direction is different from a length of the second portion in the first direction.

25. The light emitting device of claim 17, wherein the recess of the first electrode includes at least one rounded corner.

26. A light emitting device, comprising:
   a body having a first length in a first direction and a second length in a second direction perpendicular to the first direction;
   a first electrode having a top surface and a bottom surface in the body;
   a second electrode separated from the first electrode and having a top surface and a bottom surface in the body;
   at least one light emitting chip disposed on at least one of the first electrode or the second electrode, the at least one light emitting chip electrically connected to the first electrode by at least one wire, and the at least one light emitting chip electrically connected to the second electrode by at least one wire; and
   a spacer between the first electrode and the second electrode,
   wherein the first electrode comprises a first protrusion protruding in the second direction from a first lateral side and a second protrusion protruding in an opposite direction to the second direction from a second lateral side, the second lateral side being on an opposite side of the first electrode from the first lateral side,
   wherein the second electrode includes a third protrusion that protrudes in the second direction from a third lateral side and a fourth protrusion that protrudes in an opposite direction to the second direction from a fourth lateral side,
   wherein a length of the first protrusion in the second direction is greater than 10% of a length of the bottom surface of the first electrode in the second direction, and
   wherein a length of the third protrusion in the second direction is greater than 10% of a length of the bottom surface of the second electrode in the second direction.

27. The light emitting device of claim 26, wherein at least one of the first, second, third and fourth protrusions is disposed in the body.

28. The light emitting device of claim 27, wherein at least one of side edges of the first, second, third and fourth protrusions is exposed through the body.

29. The light emitting device of claim 26, wherein the at least one of the first electrode or the second electrode includes at least one groove around the at least one light emitting chip on the top surface thereof.

30. The light emitting device of claim 29, wherein the at least one groove is entirely surrounds the at least one light emitting chip.

* * * * *